(12) United States Patent
Yeong et al.

(10) Patent No.: US 11,581,410 B2
(45) Date of Patent: Feb. 14, 2023

(54) SEMICONDUCTOR DEVICE AND METHOD

(71) Applicant: Taiwan Semiconductor Manufacturing Co., Ltd., Hsinchu (TW)

(72) Inventors: Sai-Hooi Yeong, Zhubei (TW); Pei-Yu Wang, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 84 days.

(21) Appl. No.: 17/174,793

(22) Filed: Feb. 12, 2021

(65) Prior Publication Data

US 2022/0262911 A1    Aug. 18, 2022

(51) Int. Cl.

| | |
|---|---|
| *H01L 29/417* | (2006.01) |
| *H01L 29/66* | (2006.01) |
| *H01L 29/08* | (2006.01) |
| *H01L 29/06* | (2006.01) |
| *H01L 29/423* | (2006.01) |
| *H01L 21/8238* | (2006.01) |
| *H01L 27/092* | (2006.01) |
| *H01L 29/78* | (2006.01) |
| *H01L 29/775* | (2006.01) |
| *H01L 29/786* | (2006.01) |

(Continued)

(52) U.S. Cl.
CPC ............. *H01L 29/41733* (2013.01); *H01L 21/823814* (2013.01); *H01L 27/092* (2013.01); *H01L 29/0673* (2013.01); *H01L 29/0847* (2013.01); *H01L 29/42392* (2013.01); *H01L 29/6653* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/7834* (2013.01); *H01L 29/78696* (2013.01); *H01L 21/3065* (2013.01); *H01L 21/30604* (2013.01)

(58) Field of Classification Search
CPC ....... H01L 29/41733; H01L 21/823814; H01L 27/092; H01L 29/0673; H01L 29/0847; H01L 29/42392; H01L 29/66439; H01L 29/6653; H01L 29/66545; H01L 29/66553; H01L 29/66742; H01L 29/775; H01L 29/7834; H01L 29/78696; H01L 21/30604; H01L 21/3065
USPC ......................................................... 257/344
See application file for complete search history.

(56) References Cited

U.S. PATENT DOCUMENTS 9,209,247 B2    12/2015    Colinge et al.
9,236,267 B2    1/2016    De et al.
(Continued)

*Primary Examiner* — Tong-Ho Kim
(74) *Attorney, Agent, or Firm* — Slater Matsil, LLP

(57) ABSTRACT

In an embodiment, a device includes: a first nanostructure over a substrate, the first nanostructure including a channel region and a first lightly doped source/drain (LDD) region, the first LDD region adjacent the channel region; a first epitaxial source/drain region wrapped around four sides of the first LDD region; an interlayer dielectric (ILD) layer over the first epitaxial source/drain region; a source/drain contact extending through the ILD layer, the source/drain contact wrapped around four sides of the first epitaxial source/drain region; and a gate stack adjacent the source/drain contact and the first epitaxial source/drain region, the gate stack wrapped around four sides of the channel region.

20 Claims, 40 Drawing Sheets

(51) Int. Cl.
    *H01L 21/3065*    (2006.01)
    *H01L 21/306*    (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2014/0001520 A1* | 1/2014 | Glass ............... H01L 29/167 |
| | | 257/E21.409 |
| 2018/0323259 A1* | 11/2018 | Holland ............ B82Y 10/00 |
| 2019/0067121 A1 | 2/2019 | Chiang et al. |
| 2019/0371888 A1* | 12/2019 | Zhang ............... H01L 29/775 |
| 2020/0091288 A1* | 3/2020 | Lee .................. H01L 29/6656 |

* cited by examiner

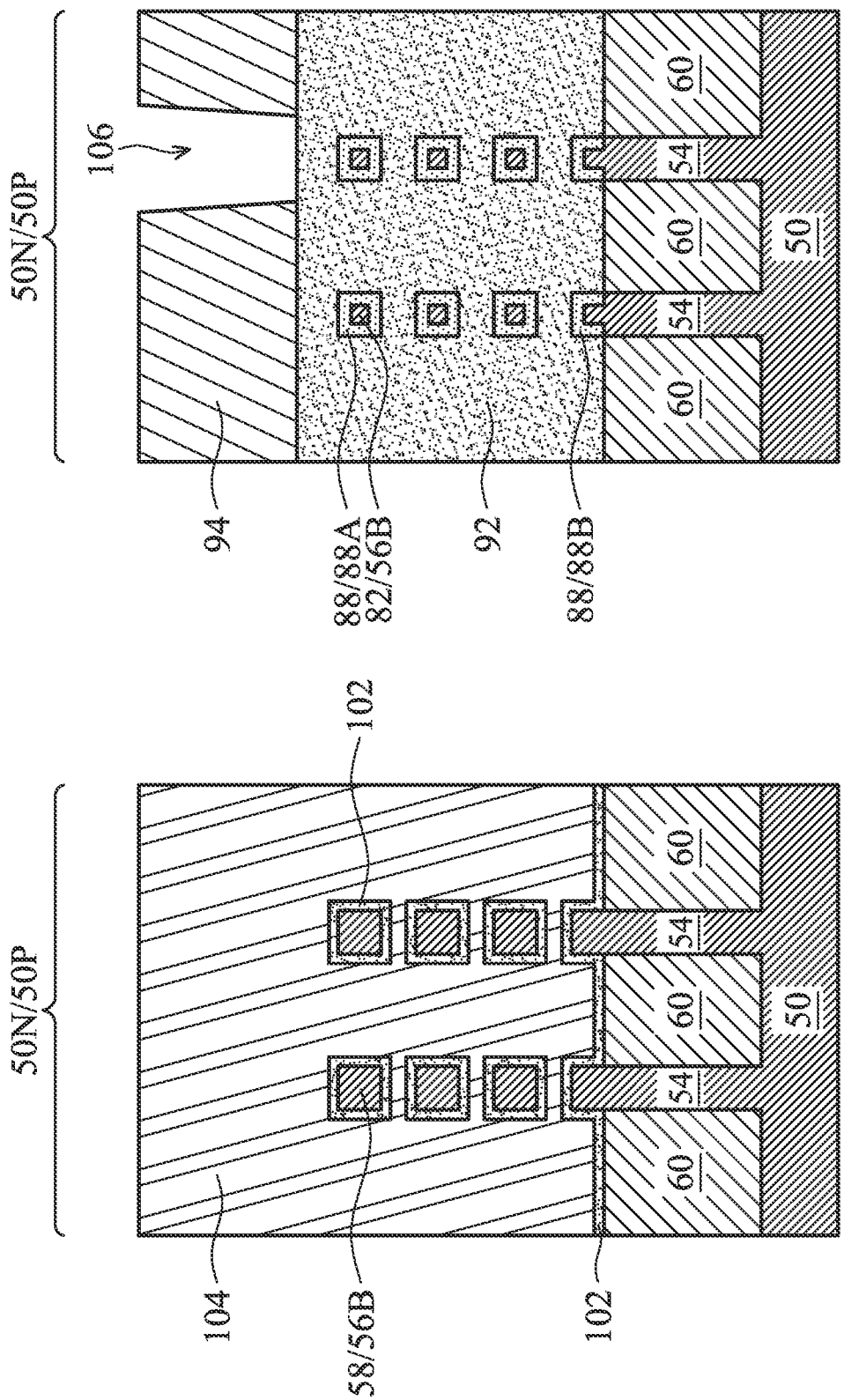

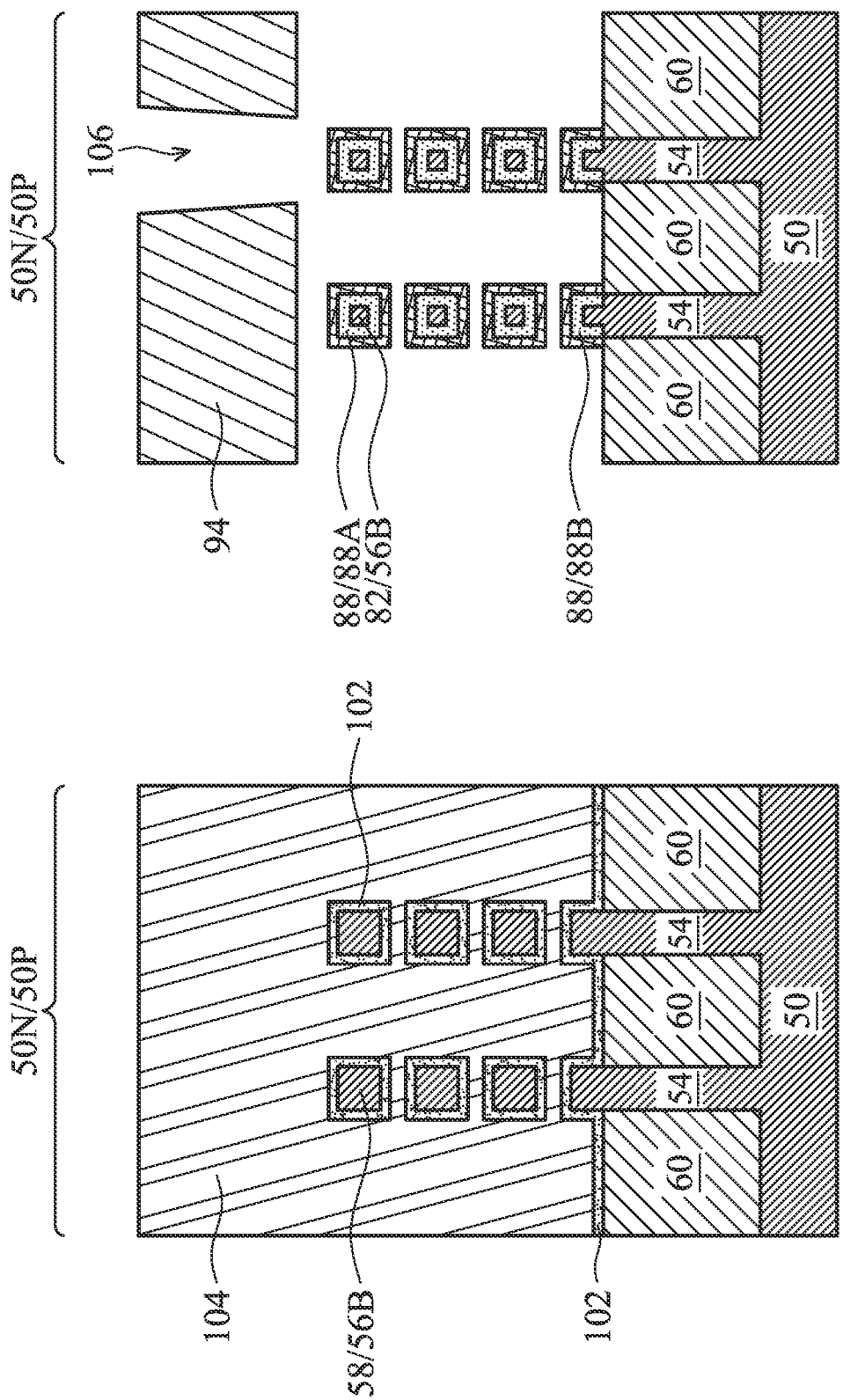

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
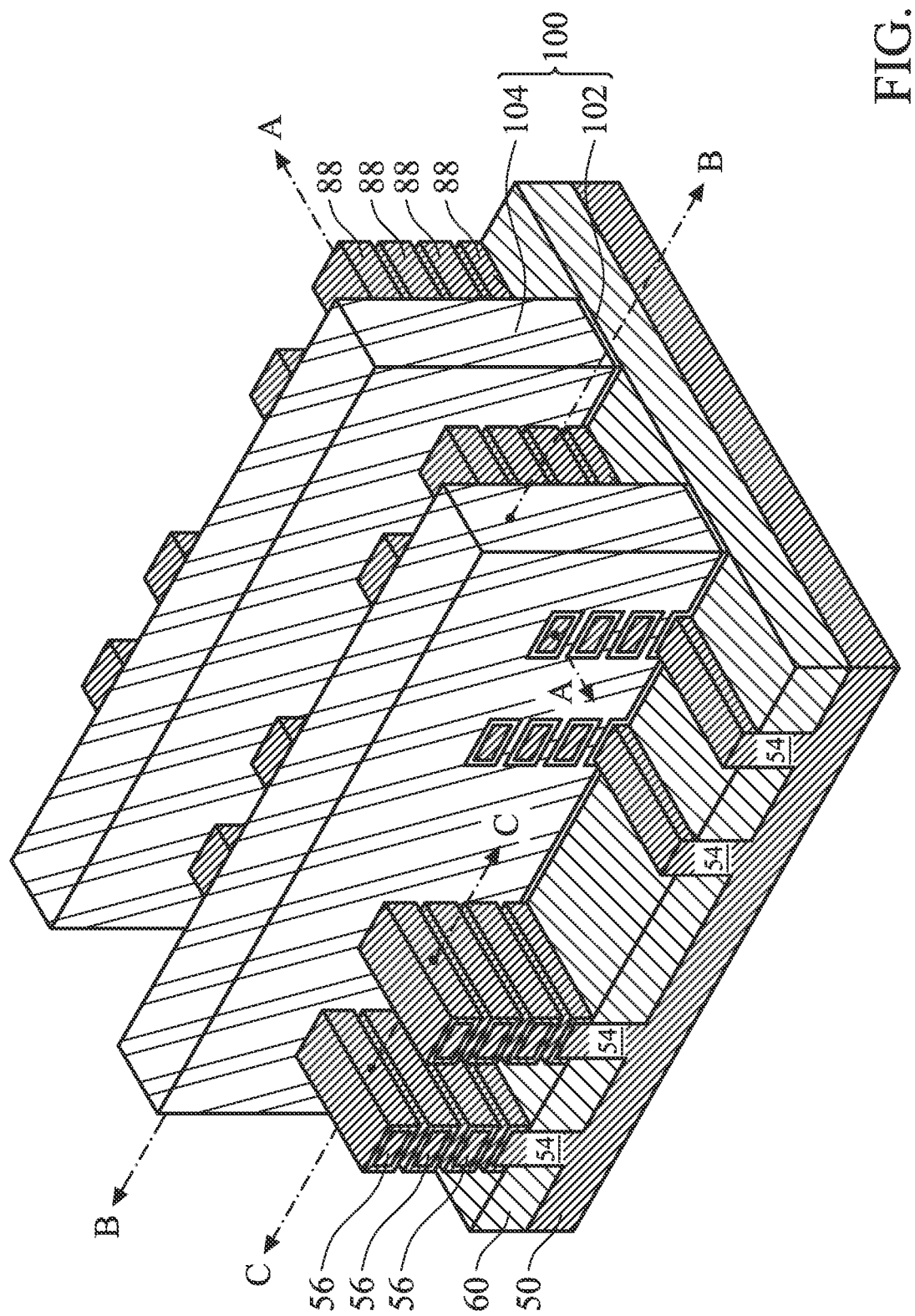
FIG. 1 illustrates an example of simplified nanostructure field effect transistors (nano-FETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, source/drain regions for nano-FETs are grown around nanostructures. The source/drain regions are wrapped around all (e.g., four) sides of the nanostructures. Subsequently formed contacts can thus wrap around all (e.g., four) sides of the source/drain regions. The contact area can thus be increased, reducing the contact resistance ($R_C$) of the source/drain contacts and improving the performance of the nano-FETs.

FIG. 1 illustrates an example of simplified nano-FETs, in accordance with some embodiments. FIG. 1 is a cutaway three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 56 over a substrate 50, such as over fins 54 extending from the substrate 50. The nanostructures 56 are semiconductor layer that act as channel regions for the nano-FETs. Isolation regions 60, such as shallow trench isolation (STI) regions, are disposed over the substrate 50 and between adjacent ones of the fins 54, which may protrude above and from between neighboring isolation regions 60. Although the isolation regions 60 are described/illustrated as being separate from the substrate 50, as used herein, the term "substrate" may refer to the semiconductor substrate alone or a combination of the semiconductor substrate and the isolation regions. Additionally, although the fins 54 are illustrated as single, continuous materials with the substrate 50, the fins 54 and/or the substrate 50 may include a single material or a plurality of materials. In this context, the fins 54 refer to the portion extending above and from between the neighboring isolation regions 60.

Gate structures 100 are wrapped around the nanostructures 56. The gate structures 100 include gate dielectrics 102 and gate electrodes 104. The gate dielectrics 102 are along top surfaces, sidewalls, and bottom surfaces of the nanostructures 56 and may extend along sidewalls and over top surfaces of the fins 54. The gate electrodes 104 are over the gate dielectrics 102. Epitaxial source/drain regions 88 are wrapped around the nanostructures 56 and are disposed on opposite sides of the gate structures 100. In embodiments where multiple transistors are formed, the epitaxial source/drain regions 88 may be shared between various transistors. For example, neighboring epitaxial source/drain regions 88 may be electrically coupled, such as by coupling the epitaxial source/drain regions 88 with a same source/drain contact. One or more interlayer dielectric (ILD) layer(s) (discussed in greater detail below) are over the epitaxial source/drain regions 88 and/or the gate structures 100, through which contacts (discussed in greater detail below) to the epitaxial source/drain regions 88 and the gate electrodes 104 are formed.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIG. 1 further illustrates reference cross-sections that are used in later figures. Cross-section A-A is along a longitudinal axis of a nanostructure 56 and in a direction, for example, of current flow between the epitaxial source/drain regions 88 of a nano-FET. Cross-section B-B is perpendicular to cross-section A-A, and is along a longitudinal axis of a gate electrode 104. Cross-section C-C is perpendicular to cross-section A-A and parallel to cross-section B-B, and extends through epitaxial source/drain regions 88 of the nano-FETs. Subsequent figures refer to these reference cross-sections for clarity.

FIGS. 2 through 6 are three-dimensional views of intermediate stages in the manufacturing of nano-FETs, in accordance with some embodiments. FIGS. 2 through 6 show a similar three-dimensional view as FIG. 1.

Figure 2:
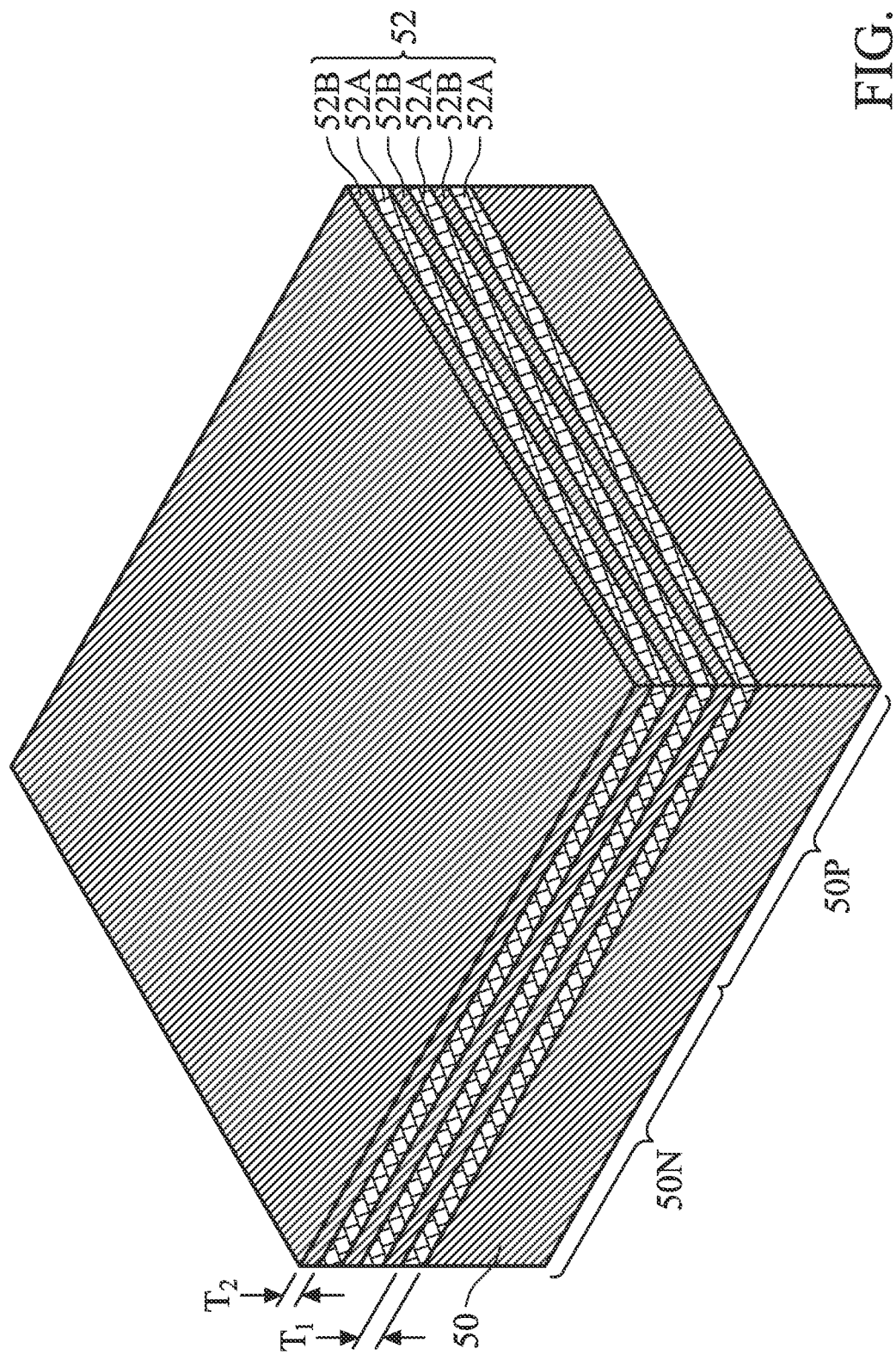
FIGS. 2 through 6 are three-dimensional views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P.

The substrate 50 may be lightly doped with a p-type or an n-type impurity. An anti-punch-through (APT) implantation may be performed on an upper portion of the substrate 50 to form an APT region. During the APT implantation, dopants may be implanted in the n-type region 50N and the p-type region 50P. The dopants may have a conductivity type opposite from a conductivity type of source/drain regions that will be subsequently formed in each of the n-type region 50N and the p-type region 50P. The APT region may extend under subsequently formed source/drain regions in the nano-FETs, which will be formed in subsequent processes. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 52 is formed over the substrate 50. The multi-layer stack 52 includes alternating first semiconductor layers 52A and second semiconductor layers 52B.

The first semiconductor layers 52A are formed of a first semiconductor material, and the second semiconductor layers 52B are formed of a second semiconductor material. The semiconductor materials may each be selected from the candidate semiconductor materials of the substrate 50. In the illustrated embodiment, the multi-layer stack 52 includes three layers of each of the first semiconductor layers 52A and the second semiconductor layers 52B. It should be appreciated that the multi-layer stack 52 may include any number of the first semiconductor layers 52A and the second semiconductor layers 52B.

In the illustrated embodiment, the second semiconductor layers 52B will be used to form channel regions for the nano-FETs in both the n-type region 50N and the p-type region 50P. The first semiconductor layers 52A are sacrificial layers (or dummy layers), which will be removed in subsequent processing to expose the top surfaces and the bottom surfaces of the second semiconductor layers 52B in both regions. The second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium.

In another embodiment, the first semiconductor layers 52A will be used to form channel regions for the nano-FETs in one region (e.g., the p-type region 50P), and the second semiconductor layers 52B will be used to form channel regions for the nano-FETs in another region (e.g., the n-type region 50N). The first semiconductor material of the first semiconductor layers 52A may be suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor material of the second semiconductor layers 52B may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without removing the second semiconductor layers 52B in the n-type region 50N, and the second semiconductor layers 52B may be removed without removing the first semiconductor layers 52A in the p-type region 50P.

Each of the layers of the multi-layer stack 52 may be formed using a process such as vapor phase epitaxy (VPE), molecular beam epitaxy (MBE), chemical vapor deposition (CVD), atomic layer deposition (ALD), or the like. Each of the layers may be formed to a small thickness, such as a thickness in a range of about 5 nm to about 30 nm. In some embodiments, one group of layers (e.g., the second semiconductor layers 52B) is formed to be thinner than the other group of layers (e.g., the first semiconductor layers 52A). For example, in embodiments where the second semiconductor layers 52B are used to form channel regions and the first semiconductor layers 52A are sacrificial layers (or dummy layers), the first semiconductor layers 52A can be formed to a first thickness $T_1$ and the second semiconductor layers 52B can be formed to a second thickness $T_2$, with the second thickness $T_2$ being from about 30% to about 60% less than the first thickness $T_1$. Forming the second semiconductor layers 52B to a smaller thickness allows the channel regions to be formed at a greater density.

Figure 3:
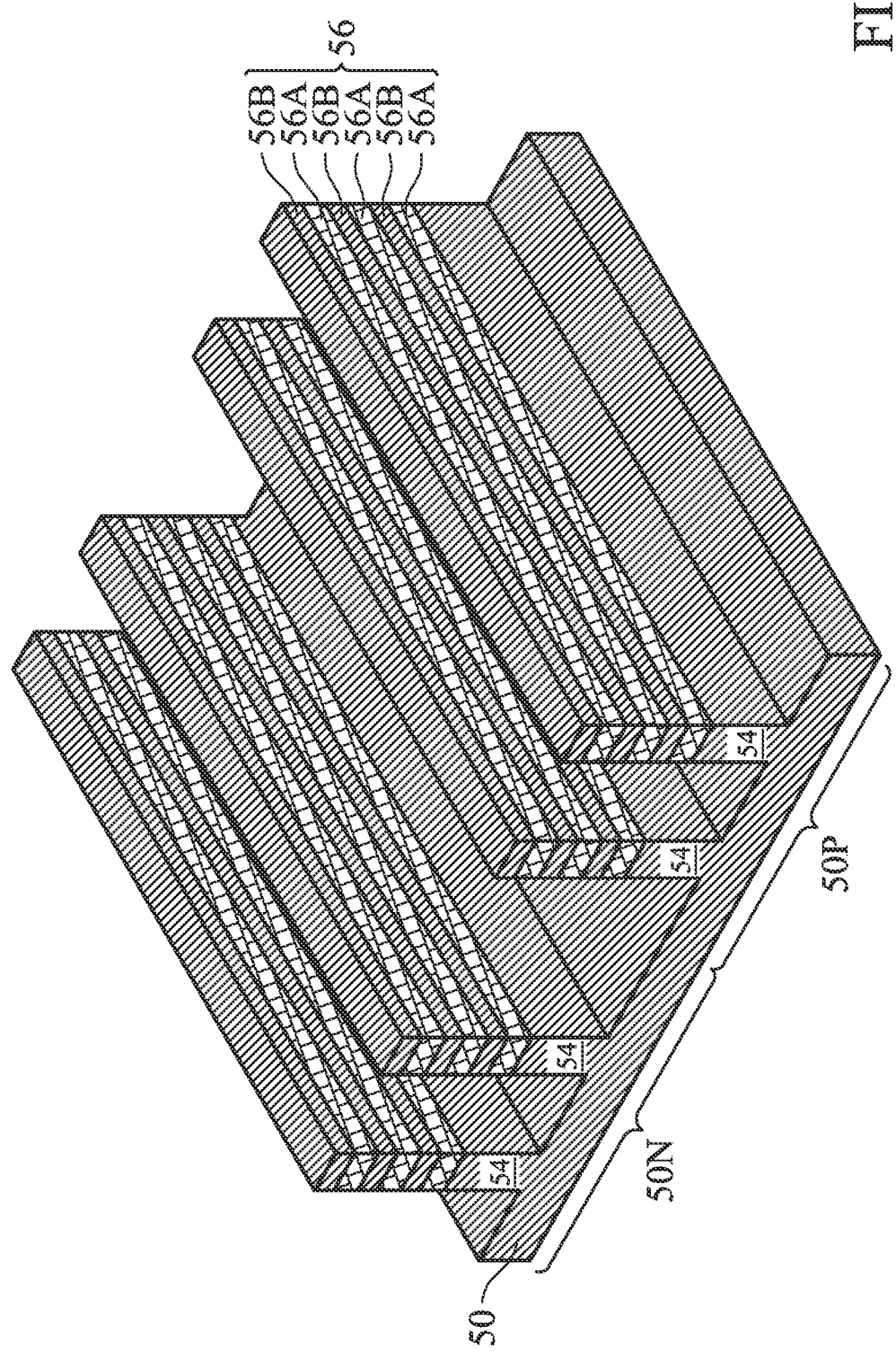

In FIG. 3, trenches are etched in the substrate 50 and the multi-layer stack 52 to form fins 54 and nanostructures 56. The fins 54 are semiconductor strips patterned in the substrate 50. The nanostructures 56 include the remaining portions of the multi-layer stack 52 on the fins 54. Specifically, nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. After formation, the second nanostructures 56B in the intermediate levels of the structure are each disposed between two of the first nanostructures 56A. The etching may be any acceptable etch process, such as a reactive ion etch (RIE), neutral beam etch (NBE), the like, or a combination thereof. The etching may be anisotropic.

The fins 54 and the nanostructures 56 may be patterned by any suitable method. For example, the fins 54 and the nanostructures 56 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 54 and the nanostructures 56.

The fins 54 and the nanostructures 56 may have widths in a range of about 8 nm to about 40 nm. The fins 54 and the nanostructures 56 in the n-type region 50N and the p-type region 50P are illustrated as having substantially equal widths for illustrative purposes. In some embodiments, the fins 54 and the nanostructures 56 in one region (e.g., the n-type region 50N) may be wider or narrower than the fins 54 and the nanostructures 56 in the other region (e.g., the p-type region 50P).

Figure 4:
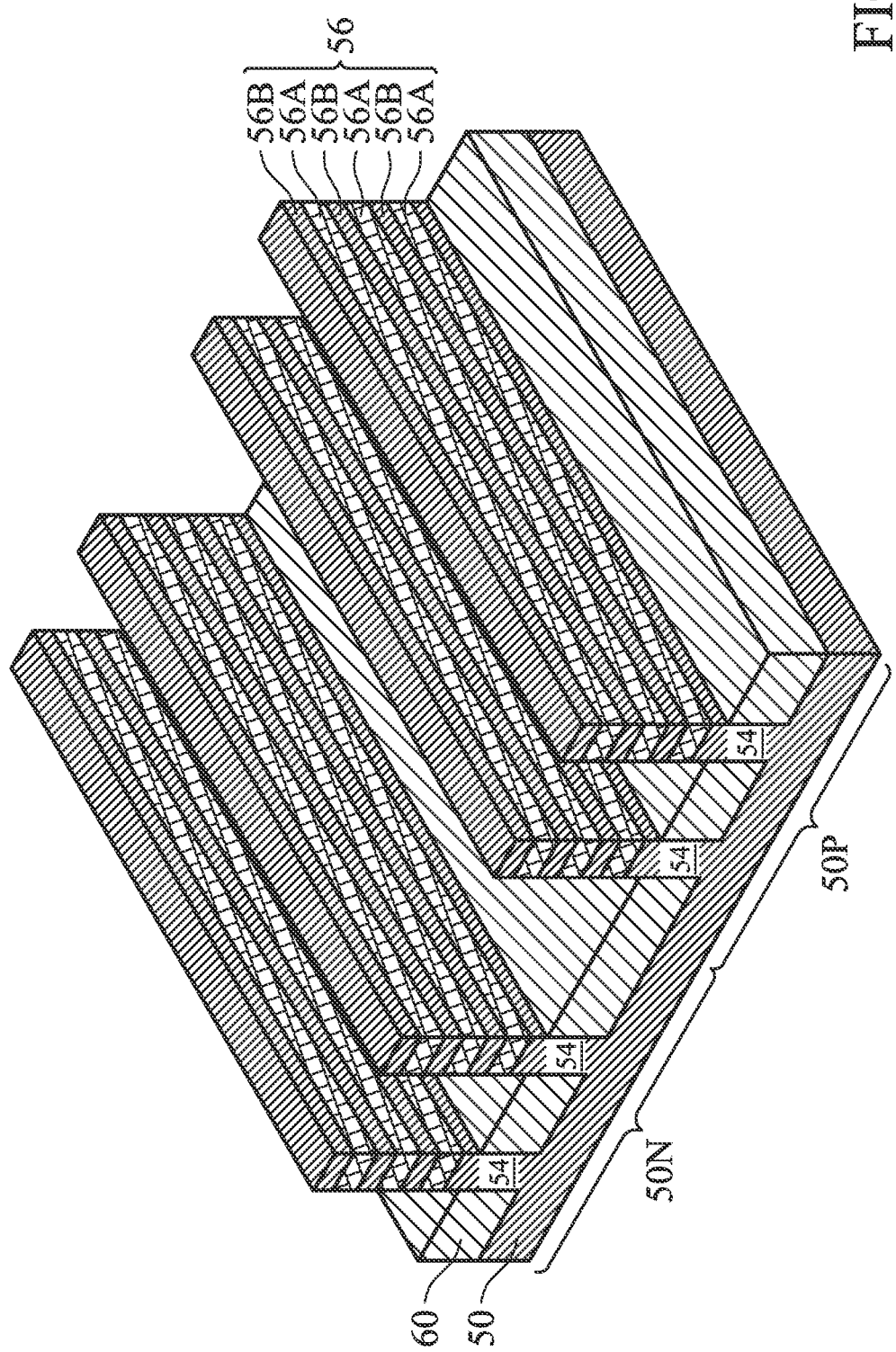

In FIG. 4, STI regions 60 are formed adjacent the fins 54. The STI regions 60 may be formed by depositing an insulation material over the substrate 50 and the nanostructures 56 and between adjacent ones of the fins 54. The insulation material may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 56. Although the insulation material is illustrated as a single layer, some embodiments may utilize multiple layers. For example, in some embodiments a liner may first be formed along surfaces of the substrate 50, the fins 54, and the nanostructures 56. Thereafter, a fill material, such as those discussed above may be formed over the liner.

A removal process is then applied to the insulation material to remove excess insulation material over the nanostructures 56. In some embodiments, a planarization process such as a chemical mechanical polish (CMP), an etch-back process, combinations thereof, or the like may be utilized. The planarization process exposes the nanostructures 56 such that top surfaces of the nanostructures 56 and the insulation material are coplanar (within process variations) after the planarization process is complete.

The insulation material is then recessed to form the STI regions 60. The insulation material is recessed such that the upper portions of the fins 54 protrude from between neighboring STI regions 60. In the illustrated embodiment, the top surfaces of the STI regions 60 are below the top surfaces of the fins 54. In some embodiments, the top surfaces of the STI regions 60 are above or coplanar (within process variations) with the top surfaces of the fins 54. Further, the top surfaces of the STI regions 60 may have a flat surface as illustrated, a convex surface, a concave surface (such as dishing), or a combination thereof. The top surfaces of the STI regions 60 may be formed flat, convex, and/or concave by an appropriate etch. The STI regions 60 may be recessed using an acceptable etching process, such as one that is selective to the material of the insulation material (e.g., etches the material of the insulation material at a faster rate than the materials of the fins 54 and the nanostructures 56). For example, an oxide removal using, for example, dilute hydrofluoric (dHF) acid may be used.

The process described above is just one example of how the fins 54 and the nanostructures 56 may be formed. In some embodiments, the fins 54 and the nanostructures 56 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 54 and the nanostructures 56. The epitaxial structures may include the alternating semiconductor materials discussed above, such as the first semiconductor material and the second semiconductor material. In embodiments where epitaxial structures are epitaxially grown, the epitaxially grown materials may be in situ doped during growth, which may obviate prior and/or subsequent implantations, although in situ and implantation doping may be used together.

Further, appropriate wells may be formed in the substrate 50, the fins 54, and/or the nanostructures 56. In some embodiments, a p-type well may be formed in the n-type region 50N, and a n-type well may be formed in the p-type region 50P. In another embodiment, p-type wells or n-type wells may be formed in both the n-type region 50N and the p-type region 50P.

In embodiments with different well types, different implant steps for the n-type region 50N and the p-type region 50P may be achieved using a photoresist or other masks. For example, a photoresist may be formed over the fins 54, the nanostructures 56, and the STI regions 60 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist is removed, such as by an acceptable ashing process.

Following the implanting of the p-type region 50P, a photoresist is formed over the fins 54, the nanostructures 56, and the STI regions 60 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
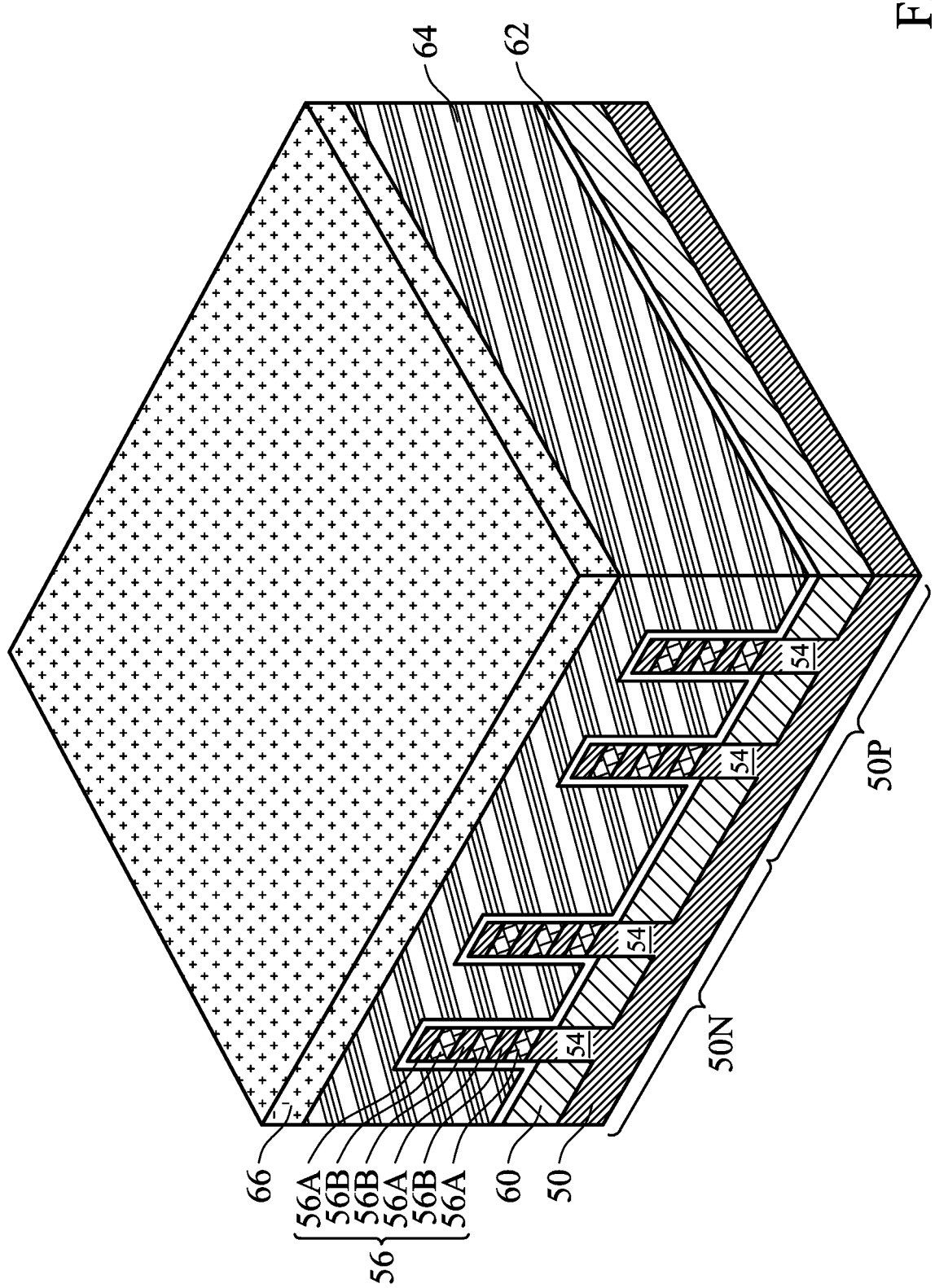

In FIG. 5, a dummy dielectric layer 62 is formed on the fins 54 and the nanostructures 56. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of material(s) that have a high etching selectivity from the etching of insulation materials, e.g., the material(s) of the STI regions 60 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. Although the dummy dielectric layer 62 is shown covering the STI regions 60, it should be appreciate that the dummy dielectric layer 62 can be formed in other manners. In some embodiments, such as when the dummy dielectric layer 62 is thermally grown, the dummy dielectric layer 62 is formed to only cover the fins 54 and the nanostructures 56.

Figure 6:
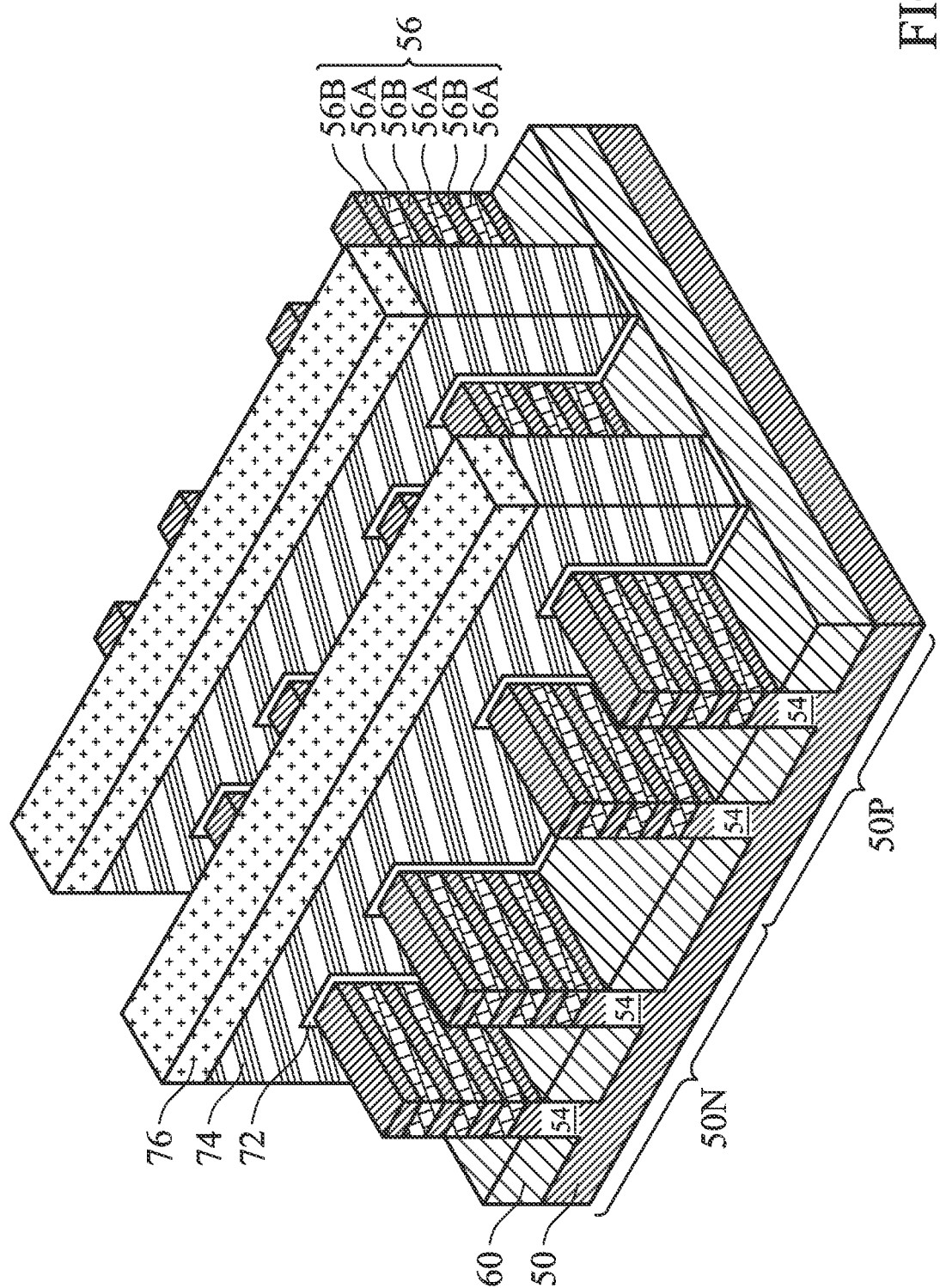

In FIG. 6, the mask layer 66 is patterned using acceptable photolithography and etching techniques to form masks 76. The pattern of the masks 76 is then transferred to the dummy gate layer 64 by an acceptable etching technique to form dummy gates 74. The pattern of the masks 76 may optionally be further transferred to the dummy dielectric layer 62 by an acceptable etching technique to form dummy dielectrics 72. The dummy gates 74 cover portions of the nanostructures 56 that will be exposed in subsequent processing to form channel regions. Specifically, the dummy gates 74 extend along the portions of the second nanostructures 56B that will be used to form channel regions 58 (see FIG. 7A). The pattern of the masks 76 may be used to physically separate adjacent dummy gates 74. The dummy gates 74 may also have lengthwise directions substantially perpendicular (within process variations) to the lengthwise directions of the fins 54. The masks 76 can optionally be removed after patterning, such as by an acceptable etching technique.

FIGS. 7A through 20C are cross-sectional views of further intermediate stages in the manufacturing of nano-FETs, in accordance with some embodiments. FIGS. 7A, 8A, 9A, 10A, 11A, 12A, 13A, 14A, 15A, 16A, 17A, 18A, 19A, and 20A are illustrated along reference cross-section A-A in FIG. 1. FIGS. 7B, 8B, 9B, 10B, 11B, 12B, 13B, 14B, 15B, 16B, 17B, 18B, 19B, and 20B are illustrated along reference cross-section B-B in FIG. 1, except two fins are shown. FIGS. 7C, 8C, 9C, 10C, 11C, 12C, 13C, 14C, 15C, 16C, 17C, 18C, 19C, and 20C are illustrated along reference cross-section C-C in FIG. 1, except two fins are shown. FIGS. 7A through 20C may be applicable to both the n-type region 50N and the p-type region 50P. Differences (if any) in the structures of the n-type region 50N and the p-type region 50P are described in the text accompanying each figure.

Figure 7A:
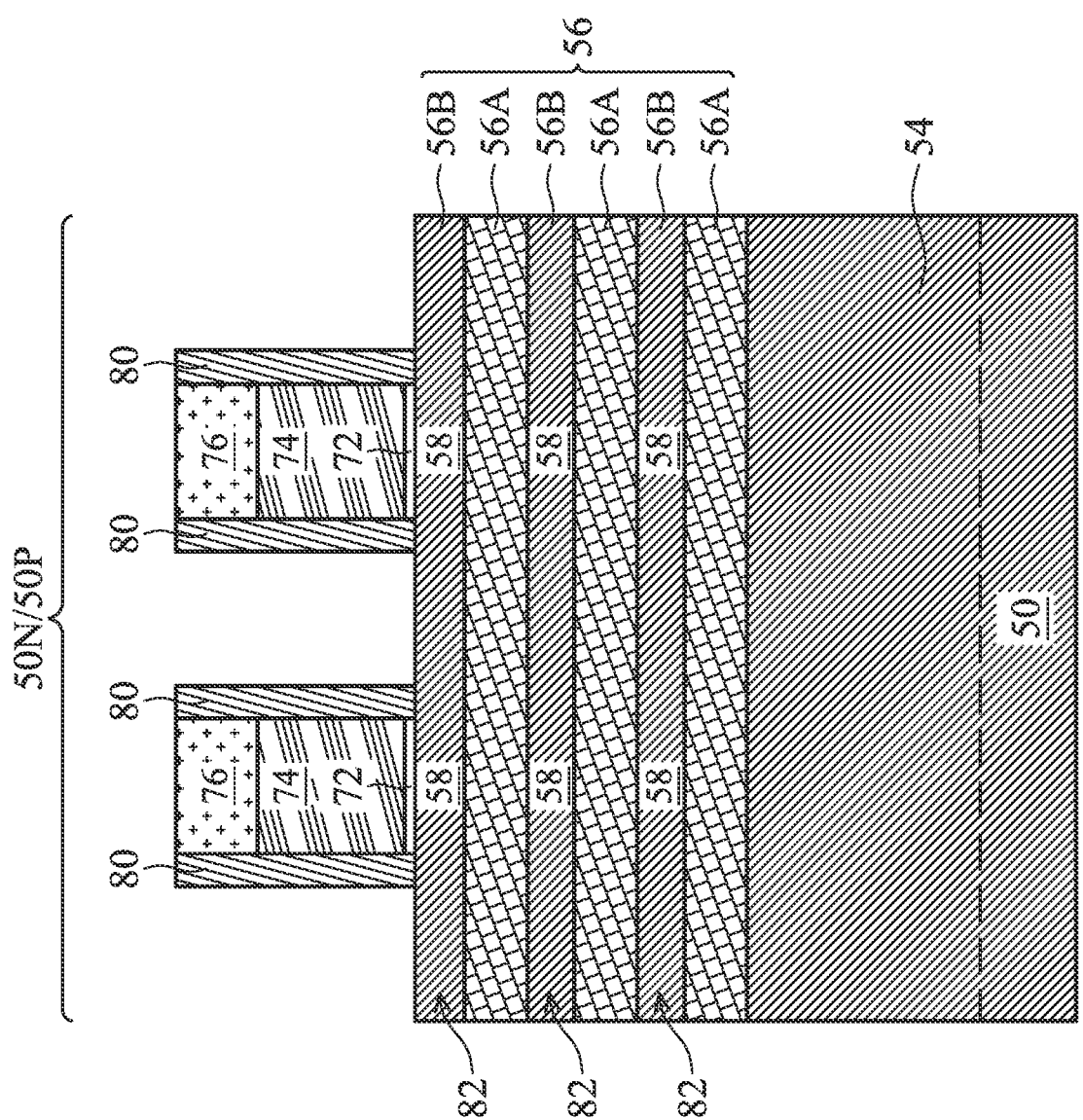
FIGS. 7A through 20C are cross-sectional views of intermediate stages in the manufacturing of nano-FETs, in accordance with some embodiments.
Figure 7C:
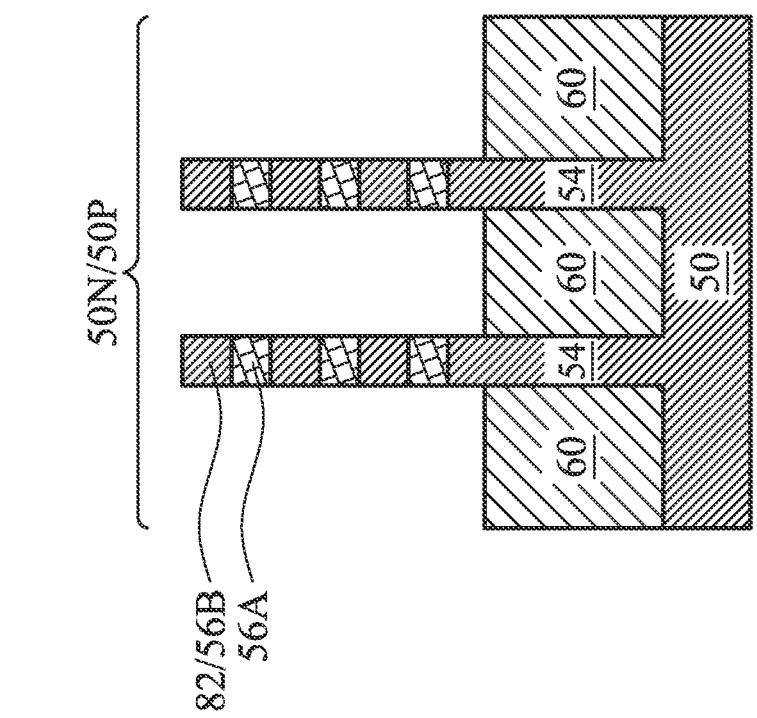
Figure 7B:
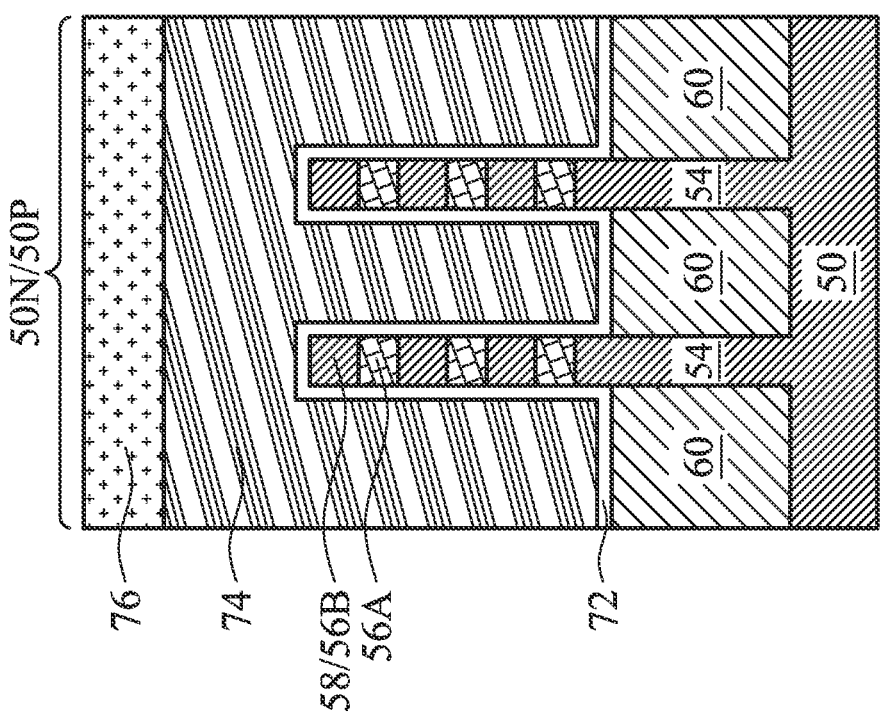

In FIGS. 7A, 7B, and 7C, gate spacers 80 are formed over the nanostructures 56 and the fins 54, on exposed sidewalls of the masks 76, the dummy gates 74, and the dummy dielectrics 72. The gate spacers 80 may be formed by conformally forming an insulating material and subsequently etching the insulating material. The insulating material of the gate spacers 80 may be silicon nitride, silicon carbonitride, silicon oxycarbonitride, combinations thereof, or the like, and may be formed by thermal oxidation, deposition, a combination thereof, or the like. The gate spacers 80 can be formed from a singled-layered insulating material or multiple layers of insulating materials. In some embodiments, the gate spacers 80 include multiple layers of silicon oxycarbonitride, where each layer may have a different composition of silicon oxycarbonitride. In some embodiments, the gate spacers 80 include a layer of silicon oxide disposed between two layers of silicon nitride. Other spacer structures may be formed. The etching of the insulating material may be anisotropic. For example, the etching process may be a dry etch such as RIE, NBE, or the like. After etching, the gate spacers 80 can have straight sidewalls or curved sidewalls. The dry etching process is performed so that the insulating material on the sidewalls of the nanostructures 56 (and optionally the fins 54) is removed. For example, the dry etching process can be performed for a duration in the range of about 1 seconds to about 15 seconds to remove the insulating material from the sidewalls of the nanostructures 56. In the embodiment shown, the insulating material is also removed from the sidewalls of the fins 54 so that no material of the gate spacers 80 remains over the STI regions 60. In another embodiment, some insulating material can remain on the sidewalls of the fins 54 but not on the sidewalls of the nanostructures 56.

Before the formation of the gate spacers 80, implants for lightly doped source/drain (LDD) regions 82 may be performed. In the embodiments with different device types, similar to the implants discussed above, a mask, such as a photoresist, may be formed over the n-type region 50N, while exposing the p-type region 50P, and appropriate type (e.g., p-type) impurities may be implanted into the nanostructures 56 and the fins 54 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the nanostructures 56 and the fins 54 exposed in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities. During the implanting, the channel regions 58 remain covered by the dummy gates 74, so that the channel regions 58 remain substantially free from the impurity implanted in the LDD regions 82.

It is noted that the above disclosure generally describes a process of forming spacers and LDD regions. Other processes and sequences may be used. For example, fewer or additional spacers may be utilized, different sequence of steps may be utilized (e.g., additional spacers may be formed and removed, etc.), and/or the like. Furthermore, the n-type and p-type devices may be formed using a different structures and steps.

Figure 8A:
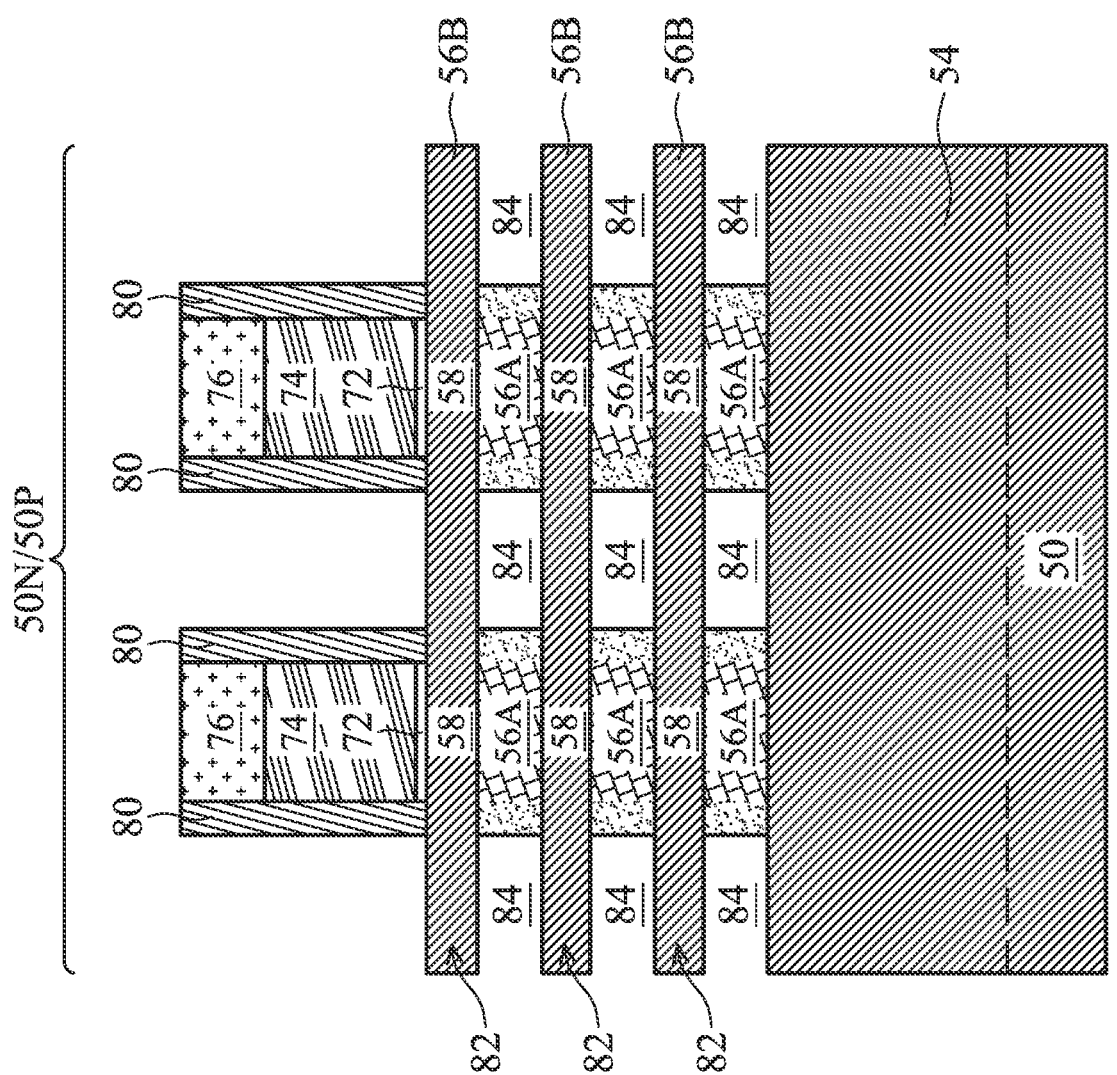
Figure 8C:
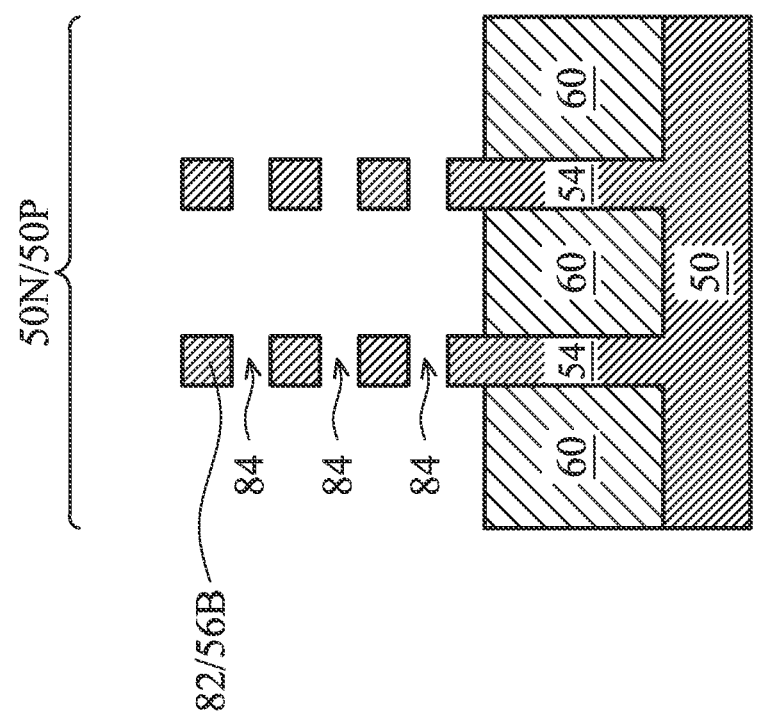
Figure 8B:
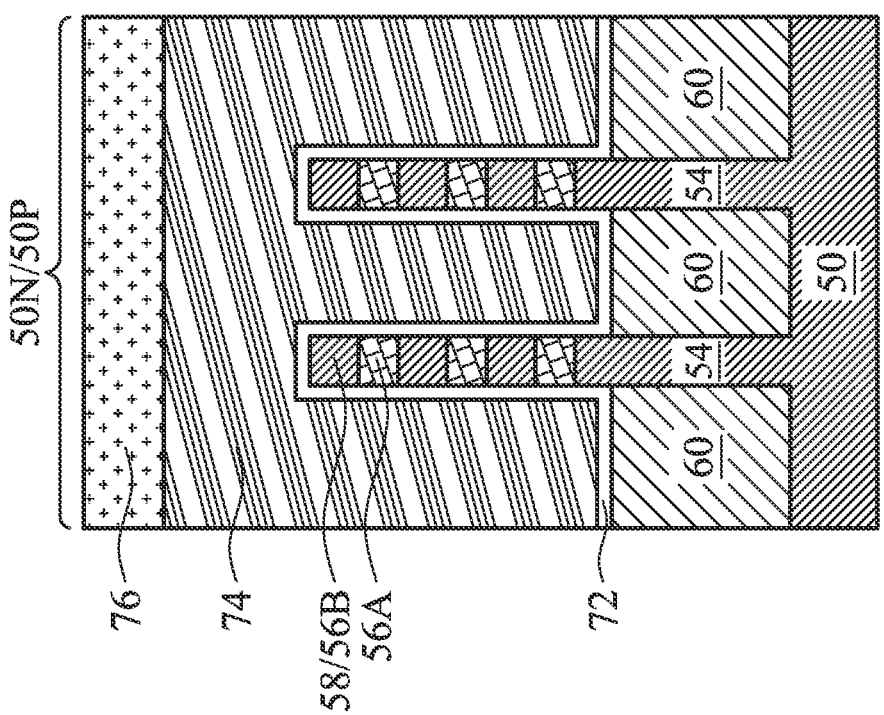

In FIGS. 8A, 8B, and 8C, portions of the first nanostructures 56A are removed to form source/drain openings 84. Specifically, the portions of the first nanostructures 56A laterally uncovered by the gate spacers 80 and the dummy gates 74 are removed to expose the top and bottom surfaces of the second nanostructures 56B, such as the top and bottom surfaces of the LDD regions 82. The source/drain openings 84 thus extend laterally between sidewalls of the fins 54, as shown by FIG. 8C. The portions of the first nanostructures 56A can be removed by an acceptable etching process that selectively etches the material of the first nanostructures 56A at a faster rate than the material(s) of the second nanostructures 56B and the fins 54. The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide (NH$_4$OH), or the like. Because the gate spacers 80 do not extend along sidewalls of the nanostructures 56, the first nanostructures 56A can be completely removed in the cross-section of FIG. 8C.

Figure 9A:
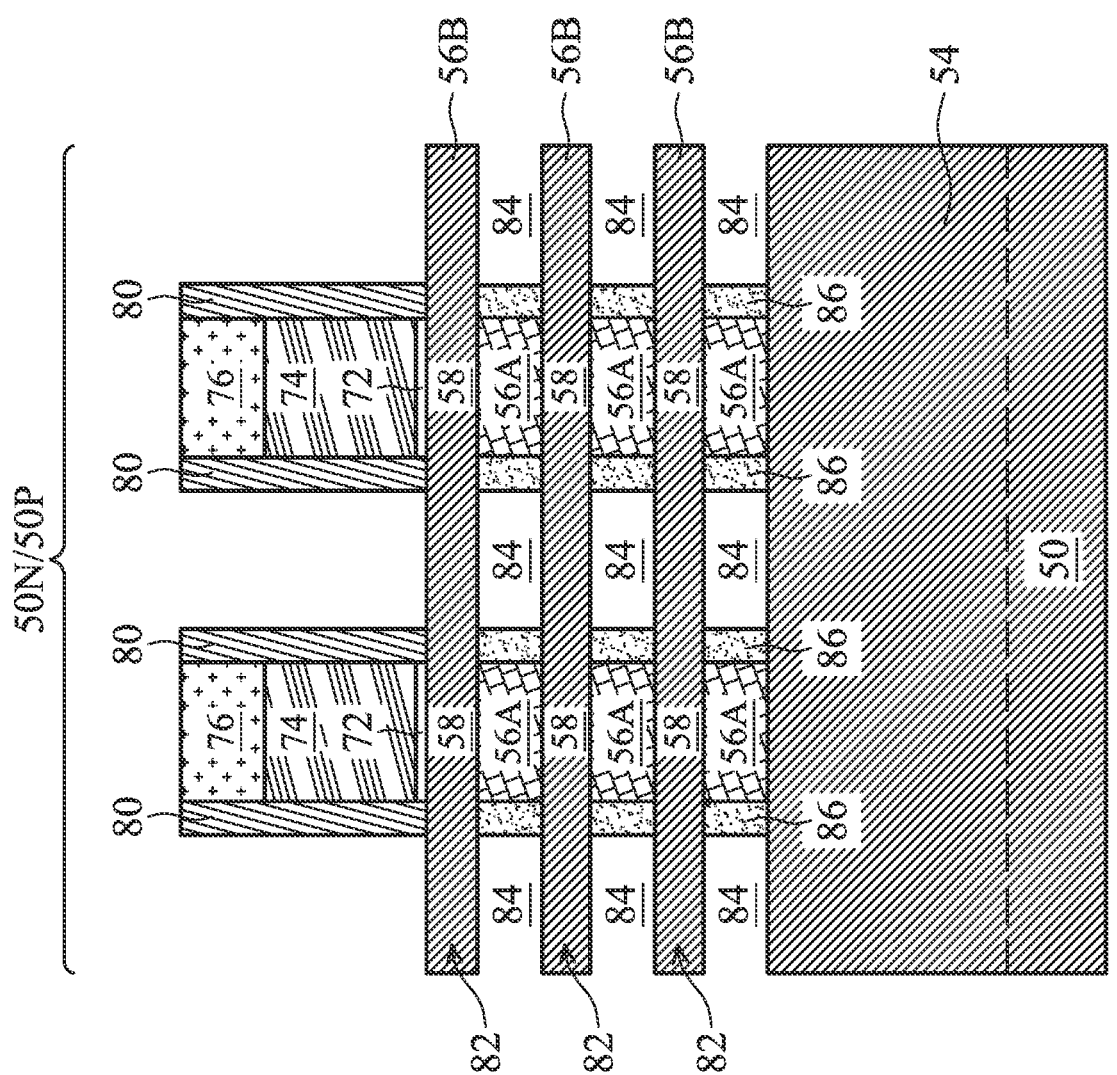
Figure 9C:
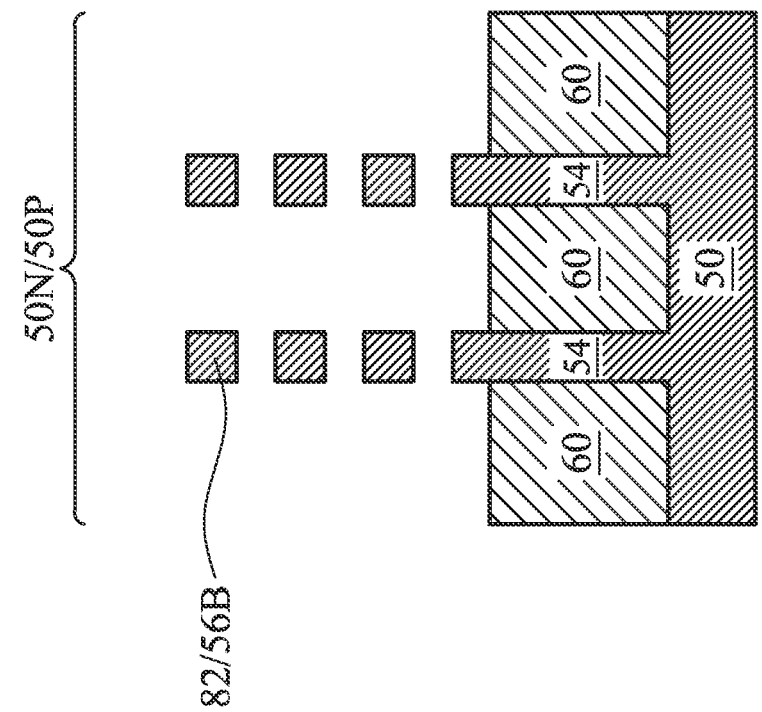
Figure 9B:
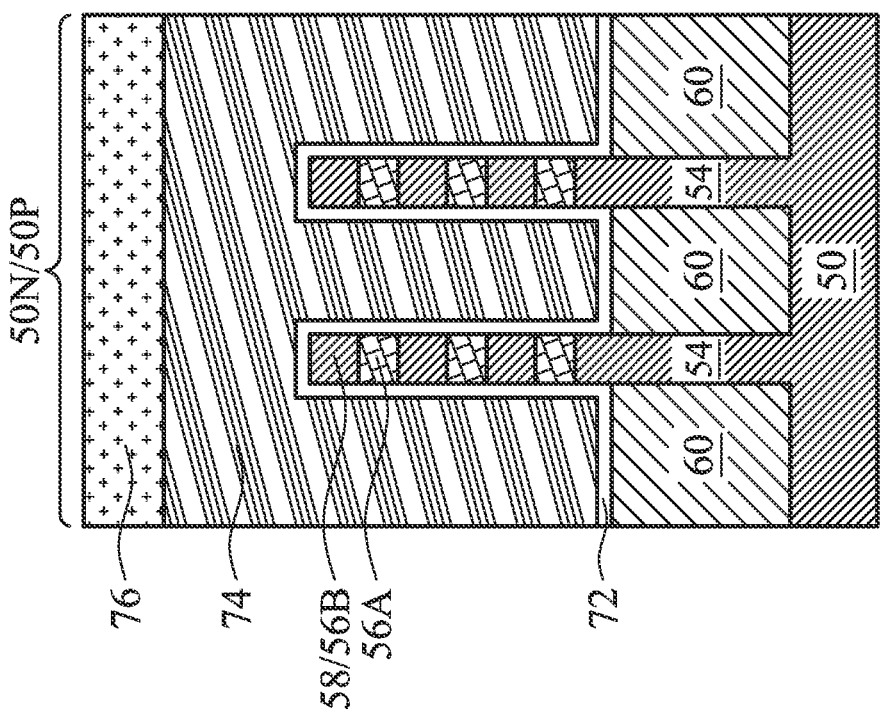

In FIGS. 9A, 9B, and 9C, inner spacers 86 are optionally formed on the sidewalls of the remaining portions of the first nano structures 56A, e.g., those sidewalls expose by the source/drain openings 84. As will be discussed in greater detail below, source/drain regions will be subsequently formed in the source/drain openings 84, and the first nanostructures 56A will be subsequently replaced with corresponding gate structures. The inner spacers 86 act as isolation features between the subsequently formed source/drain regions and the subsequently formed gate structures. Further, the inner spacers 86 may be used to prevent damage to the subsequently formed source/drain regions by subsequent etching processes, such as etching processes used to subsequently form the gate structures.

As an example to form the inner spacers 86, the source/drain openings 84 can be expanded. Specifically, portions of the sidewalls of the first nanostructures 56A exposed by the source/drain openings 84 may be recessed. Although sidewalls of the first nanostructures 56A are illustrated as being straight, the sidewalls may be concave or convex. The sidewalls may be recessed by an acceptable etching process that selectively etches the material of the first nanostructures 56A at a faster rate than the material(s) of the second nanostructures 56B and the fins 54. The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride. In some embodiments, the same etching process may be continually performed to both form the source/drain openings 84 and recess the sidewalls of the first nanostructures 56A. The inner spacers 86 can then be formed by conformally forming an insulating material and subsequently etching the insulating material. The insulating material may be a material such as silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as RIE, NBE, or the like. Although outer sidewalls of the inner spacers 86 are illustrated as being flush with respect to the sidewalls of the gate spacers 80, the outer sidewalls of the inner spacers 86 may extend beyond or be recessed from the sidewalls of the gate spacers 80. In other words, the inner spacers 86 may partially fill, completely fill, or overfill the sidewall recesses. Moreover, although the sidewalls of the inner spacers 86 are illustrated as being straight, the sidewalls of the inner spacers 86 may be concave or convex.

Figure 10A:
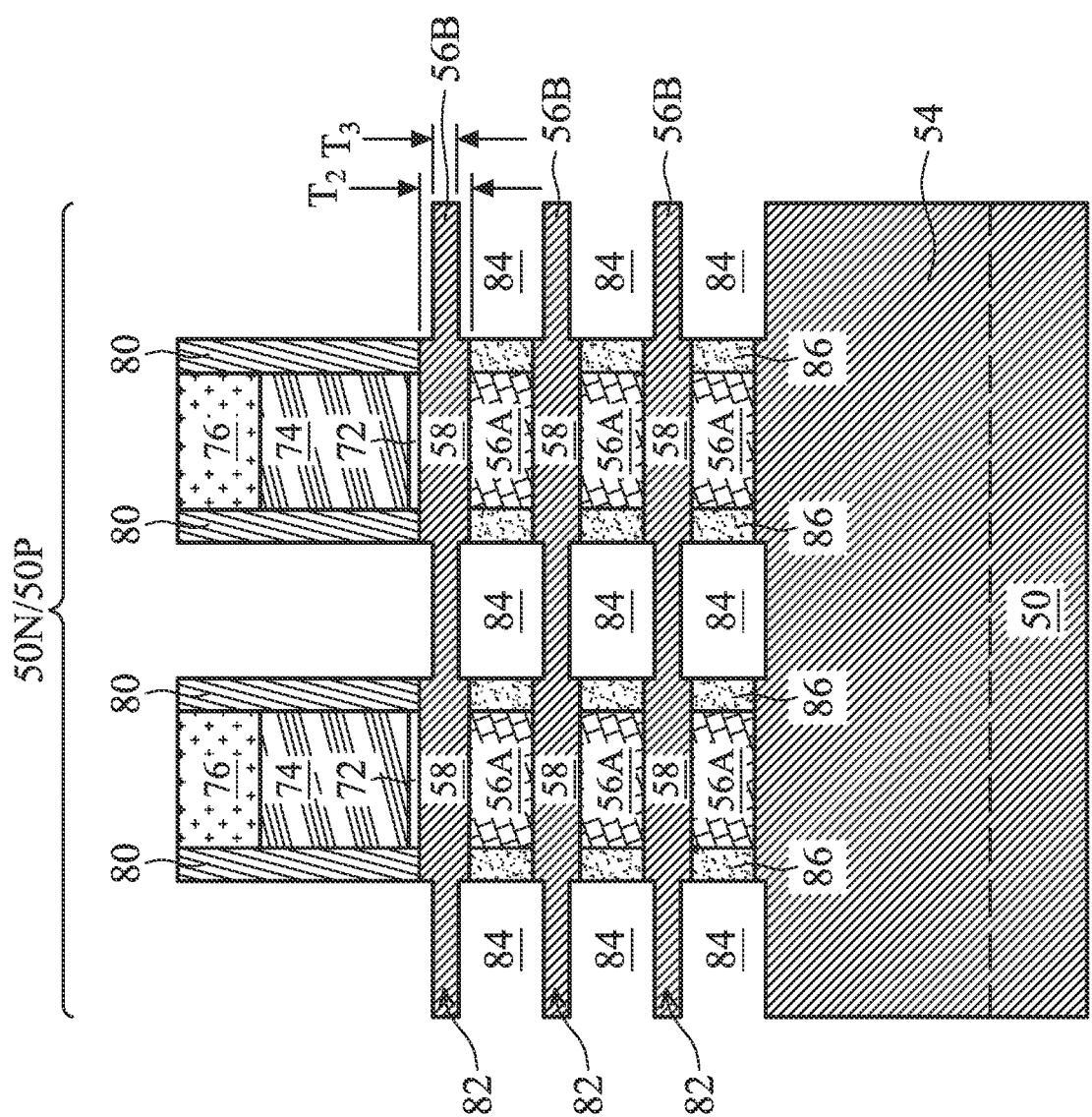
Figure 10C:
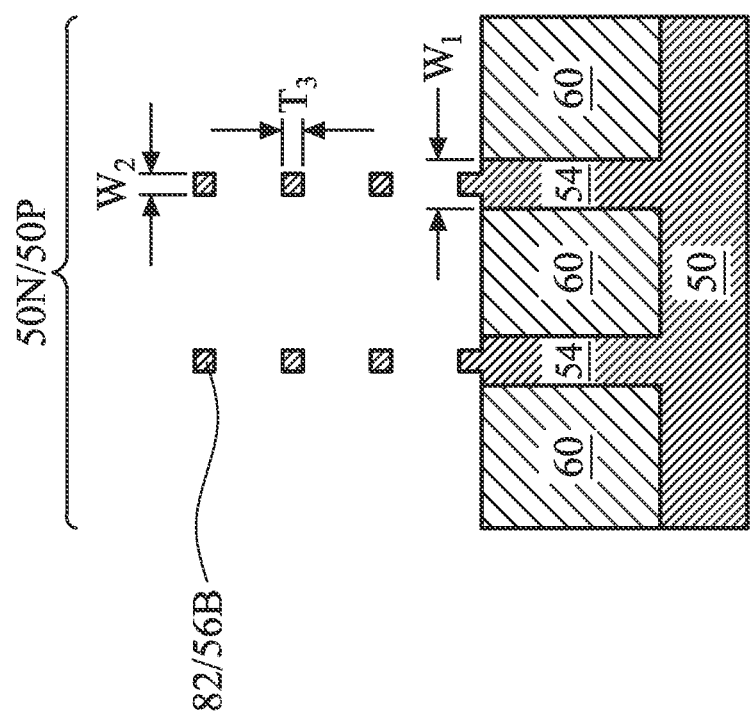
Figure 10B:
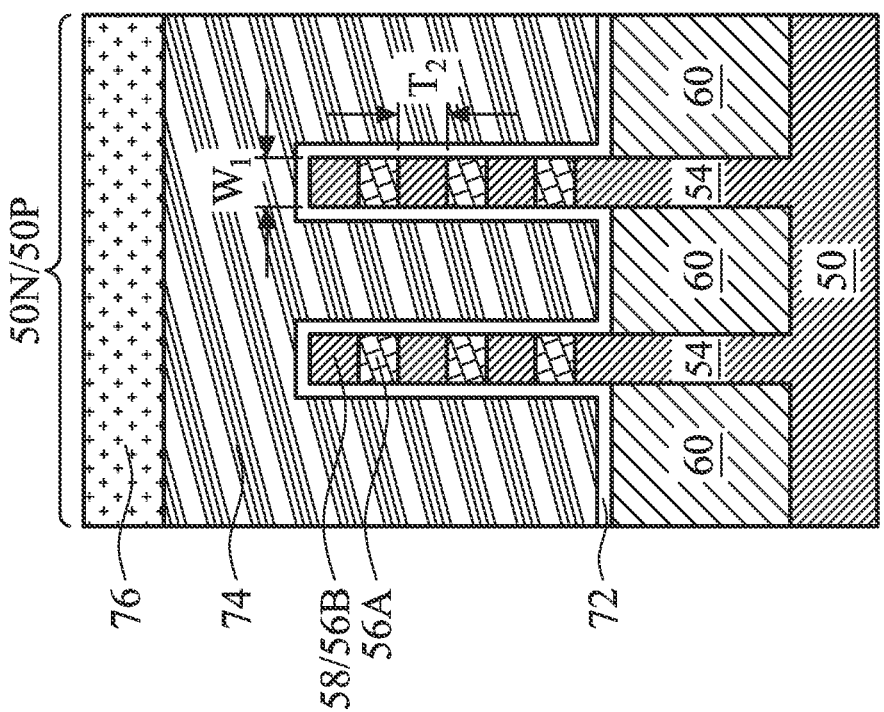

In FIGS. 10A, 10B, and 10C, the portions of the second nanostructures 56B and the fins 54 exposed by the source/drain openings 84 are optionally trimmed. The trimming reduces the dimensions (e.g., thicknesses and widths) of the exposed portions of the second nanostructures 56B (e.g., the LDD regions 82), with the unexposed portions of the second nanostructures 56B (e.g., the channel regions 58) retaining their original dimensions. The unexposed portions of the second nanostructures 56B are those portions covered by the gate spacers 80 and the dummy gates 74. The unexposed portions of the fins 54 are those portions extending above the STI regions 60. For example, the trimming may reduce the thicknesses of the exposed portions of the second nanostructures 56B from the second thickness $T_2$ (discussed above with respect to FIG. 2) to a third thickness $T_3$, with the third thickness $T_3$ being in a range of about 3 nm to about 15 nm, and the third thickness $T_3$ being from about 25% to about 40% less than the second thickness $T_2$. Similarly, the trimming may reduce the widths of the exposed portions of the fins 54 and the second nanostructures 56B from a first width $W_1$ to a second width $W_2$, with the first width $W_1$ being in a range of about 5 nm to about 20 nm, the second width $W_2$ being in a range of about 3 nm to about 15 nm, and the second width $W_2$ being from about 25% to about 50% less than the first width $W_1$. After the trimming, the second nanostructures 56B have a first perimeter in the cross-section of FIG. 10B (e.g., twice the sum of the second thickness $T_2$ and the first width $W_1$) and have a second perimeter in the cross-section of FIG. 10C (e.g., twice the sum of the third thickness $T_3$ and the second width $W_2$), with the second perimeter being smaller than the first perimeter. The trimming expands the source/drain openings 84 so that they can accommodate larger source/drain regions for the nano-FETs. The exposed portions of the second nanostructures 56B and the fins 54 may be trimmed by an acceptable etching process that selectively etches the material(s) of the second nanostructures 56B and the fins 54 at a faster rate than the materials of the first nanostructures 56A, the inner spacers 86, and the gate spacers 80. The etching may be isotropic. For example, when the fins 54 and the second nanostructures 56B are formed of silicon and the first nanostructures 56A are formed of silicon germanium, the etching process may be a wet etch using a diluted ammonium hydroxide-hydrogen peroxide mixture (APM), a sulfuric acid-hydrogen peroxide mixture (SPM), or the like. When the trimming process is omitted, the channel regions 58 and the LDD regions 82 can each have the same thickness.

Figure 11A:
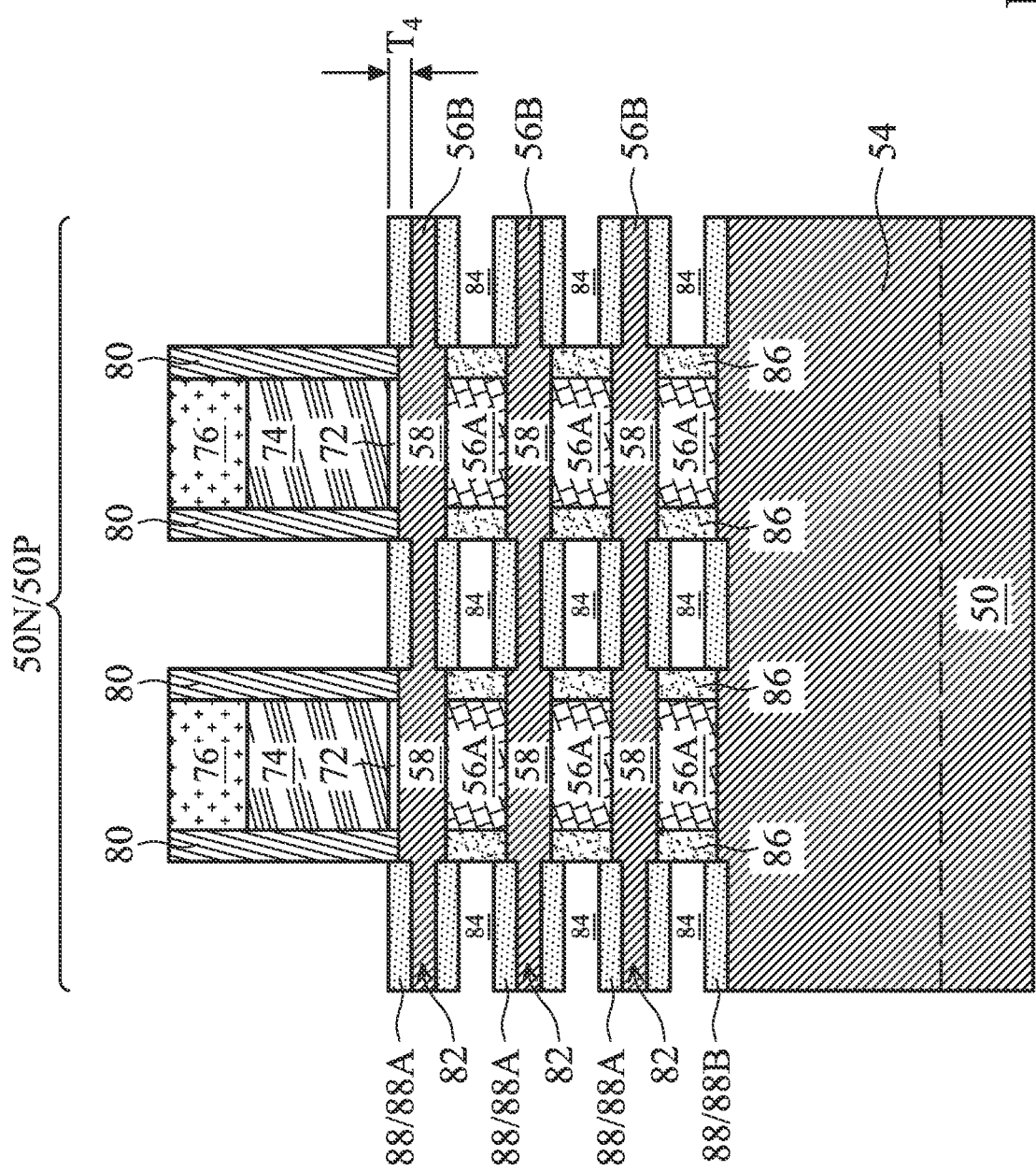
Figure 11B:
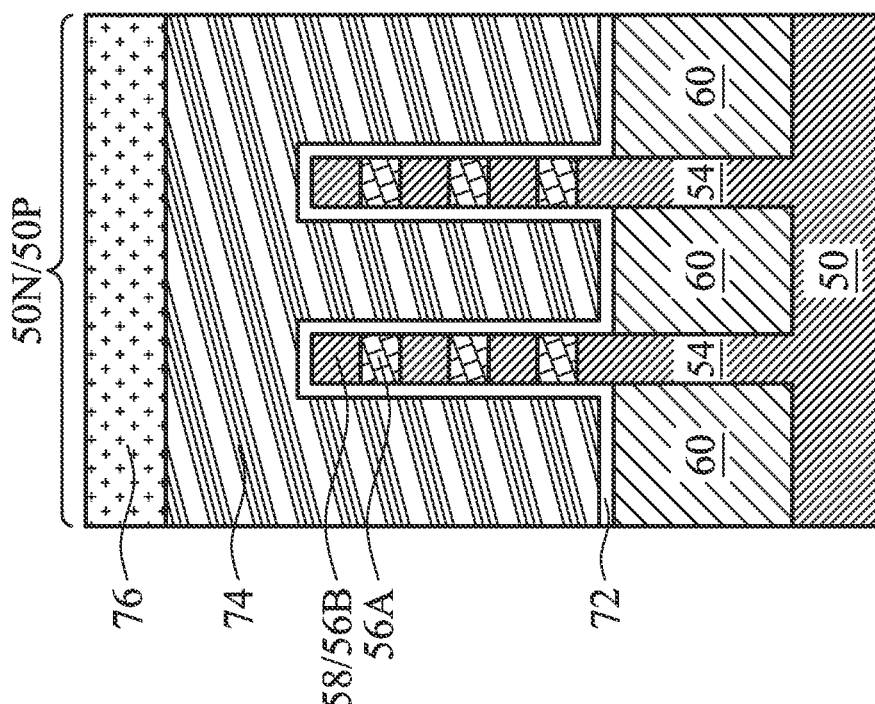
Figure 11C:
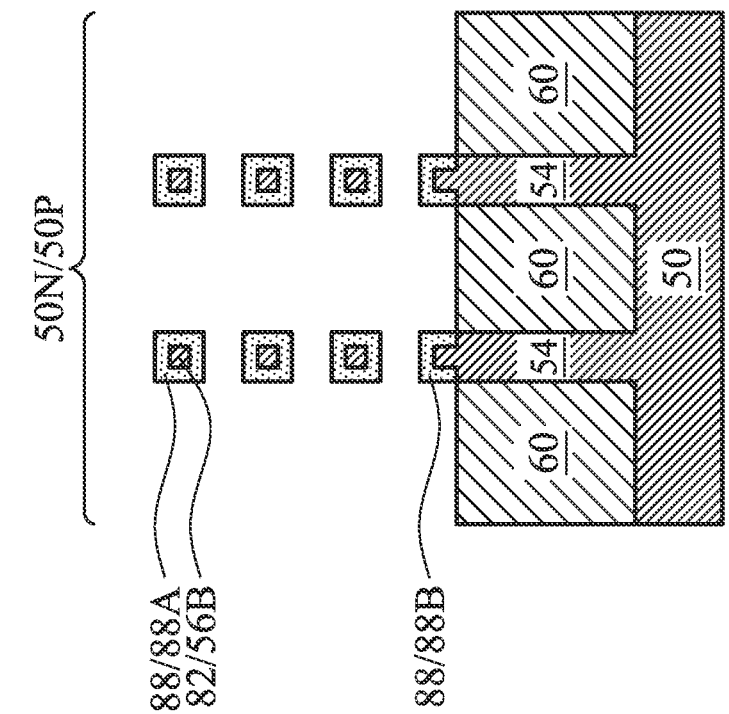

In FIGS. 11A, 11B, and 11C, epitaxial source/drain regions 88 are formed in the source/drain openings 84 and around the exposed/trimmed portions of the second nanostructures 56B (e.g., the LDD regions 82). After formation, the epitaxial source/drain regions 88 are wrapped around four sides (e.g., top surfaces, sidewalls, and bottom surfaces) of the second nanostructures 56B. The epitaxial source/drain regions 88 thus completely surround the second nanostructures 56B in the cross-section of FIG. 11C. The epitaxial source/drain regions 88 can also optionally be formed on exposed/trimmed portions of the fins 54, so that a first subset of the epitaxial source/drain regions 88A are wrapped around the second nanostructures 56B and a second subset of the epitaxial source/drain regions 88B extend along the fins 54. The epitaxial source/drain regions 88 are formed in the source/drain openings 84 such that respective groups of the epitaxial source/drain regions 88 are disposed between neighboring pairs of the dummy gates 74. In some embodiments, the gate spacers 80 and the inner spacers 86 are used to separate the epitaxial source/drain regions 88 from the dummy gates 74 and the first nanostructures 56A by an appropriate lateral distance so that the epitaxial source/drain regions 88 do not short out subsequently formed gates of the nano-FETs. The epitaxial source/drain regions 88 may be formed in contact with the inner spacers 86 (if present). When the nanostructures 56B are trimmed, the epitaxial source/drain regions 88 can exert stress on the channel regions 58, thereby improving performance.

The epitaxial source/drain regions 88 in the n-type region 50N may be formed by masking the p-type region 50P. Then, the epitaxial source/drain regions 88 are epitaxially grown in the source/drain openings 84 in the n-type region 50N. The epitaxial source/drain regions 88 may include any acceptable material appropriate for n-type nano-FETs. For example, the epitaxial source/drain regions 88 in the n-type region 50N may include materials exerting a tensile strain on the channel regions 58, such as silicon, silicon carbide, phosphorous doped silicon carbide, silicon phosphide, or the like. The epitaxial source/drain regions 88 in the n-type region 50N may have surfaces raised from respective surfaces of the second nanostructures 56B and the fins 54, and may have facets.

The epitaxial source/drain regions 88 in the p-type region 50P may be formed by masking the n-type region 50N. Then, the epitaxial source/drain regions 88 are epitaxially grown in the source/drain openings 84 in the p-type region 50P. The epitaxial source/drain regions 88 may include any acceptable material appropriate for p-type nano-FETs. For example, the epitaxial source/drain regions 88 in the p-type region 50P may include materials exerting a compressive strain on the channel regions 58, such as silicon germanium, boron doped silicon germanium, germanium, germanium tin, or the like. The epitaxial source/drain regions 88 in the p-type region 50P may also have surfaces raised from respective surfaces of the second nanostructures 56B and the fins 54, and may have facets.

The epitaxial source/drain regions 88, the second nanostructures 56B, and/or the fins 54 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 88 may be in situ doped during growth.

As a result of the epitaxy processes used to form the epitaxial source/drain regions 88, upper surfaces of the epitaxial source/drain regions 88 have facets which expand laterally outward beyond surfaces of the second nanostructures 56B and the fins 54. In embodiments where no material of the gate spacers 80 remains over the STI regions 60, the epitaxial source/drain regions 88B can extend along and contact the STI regions 60. The epitaxial source/drain regions 88 are formed to a thickness $T_4$ that is selected so the epitaxial source/drain regions 88 do not merge during the epitaxy process. In some embodiments, the thickness $T_4$ of the epitaxial source/drain regions 88 is up to about one quarter of the original thickness $T_1$ (discussed above with respect to FIG. 2) of the first nanostructures 56A. For example, the thickness $T_4$ can be in the range of about 5 nm to about 15 nm. Forming the epitaxial source/drain regions 88 to a thickness $T_4$ in this range allows merging of the epitaxial source/drain regions 88 to be avoided. Forming the epitaxial source/drain regions 88 to a thickness $T_4$ outside of this range may not allow merging of the epitaxial source/drain regions 88 to be avoided. Avoiding merging of the epitaxial source/drain regions 88 allows subsequently formed source/drain contacts to wrap around all (e.g., four) sides of the epitaxial source/drain regions 88A, thereby increasing the contact area and reducing the contact resistance ($R_C$) of the source/drain contacts.

The epitaxial source/drain regions 88 may include one or more semiconductor material layers. For example, the epitaxial source/drain regions 88 may include first semiconductor material layers, second semiconductor material layers, and third semiconductor material layers. Any number of semiconductor material layers may be used for the epitaxial source/drain regions 88. Each of the first semiconductor material layers, the second semiconductor material layers, and the third semiconductor material layers may be formed of different semiconductor materials and/or may be doped to different dopant concentrations. In some embodiments, the first semiconductor material layers may have a dopant concentration that is less than the second semiconductor material layers and greater than the third semiconductor material layers. When the epitaxial source/drain regions 88 include three semiconductor material layers, the first semiconductor material layers may be grown from the second nanostructures 56B and the fins 54, the second semiconductor material layers may be grown from the first semiconductor material layers, and the third semiconductor material layers may be grown from the second semiconductor material layers.

Figure 12A:
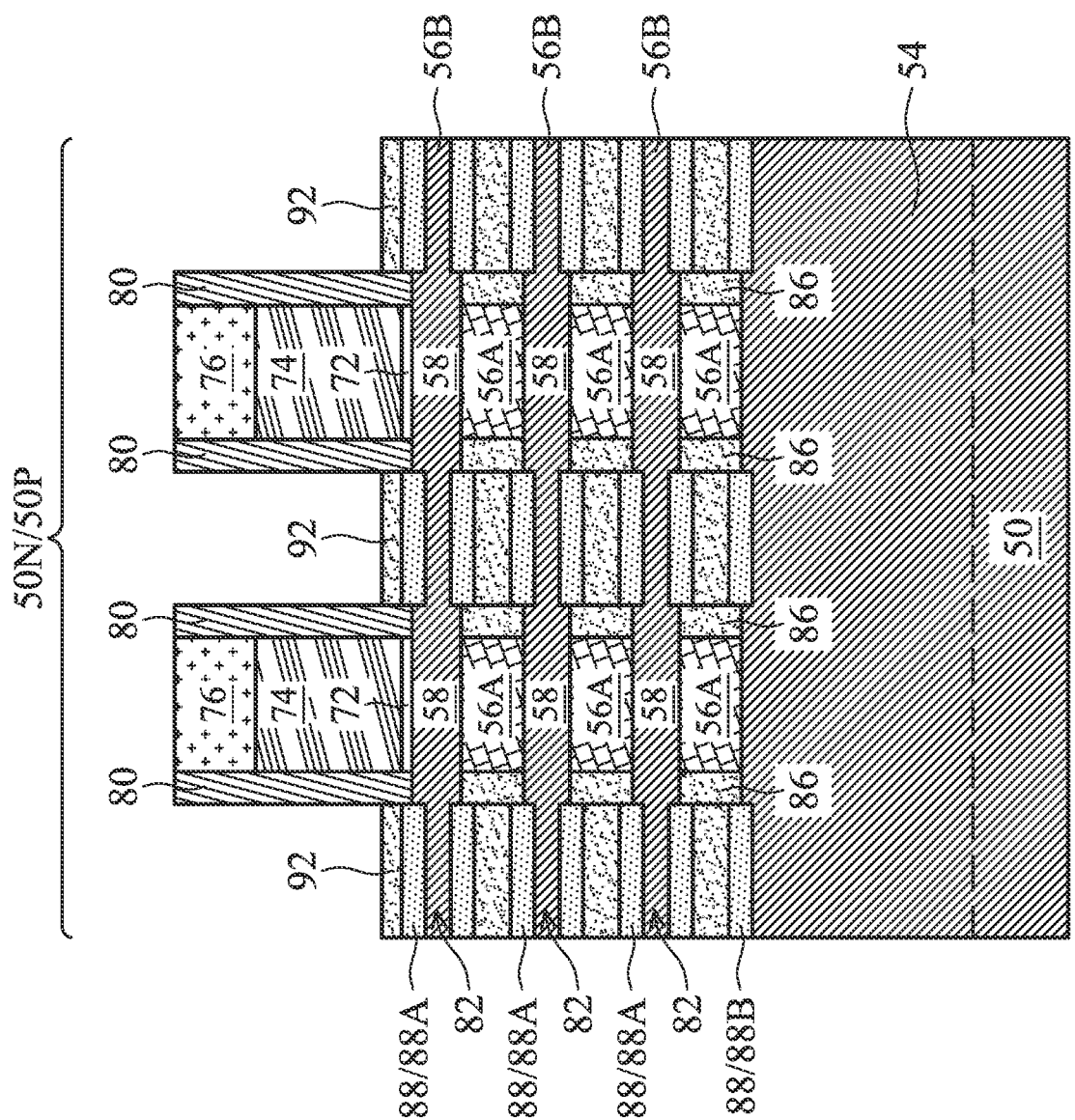
Figure 12C:
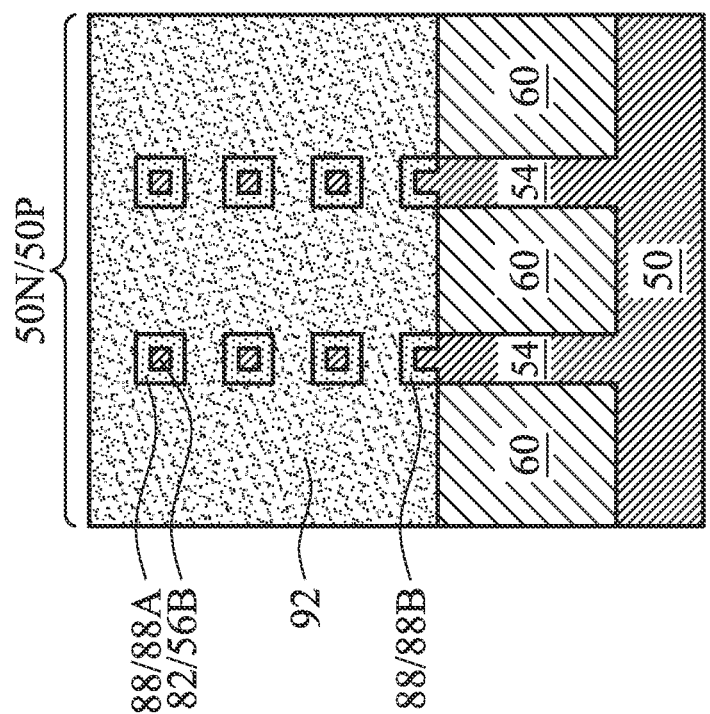
Figure 12B:
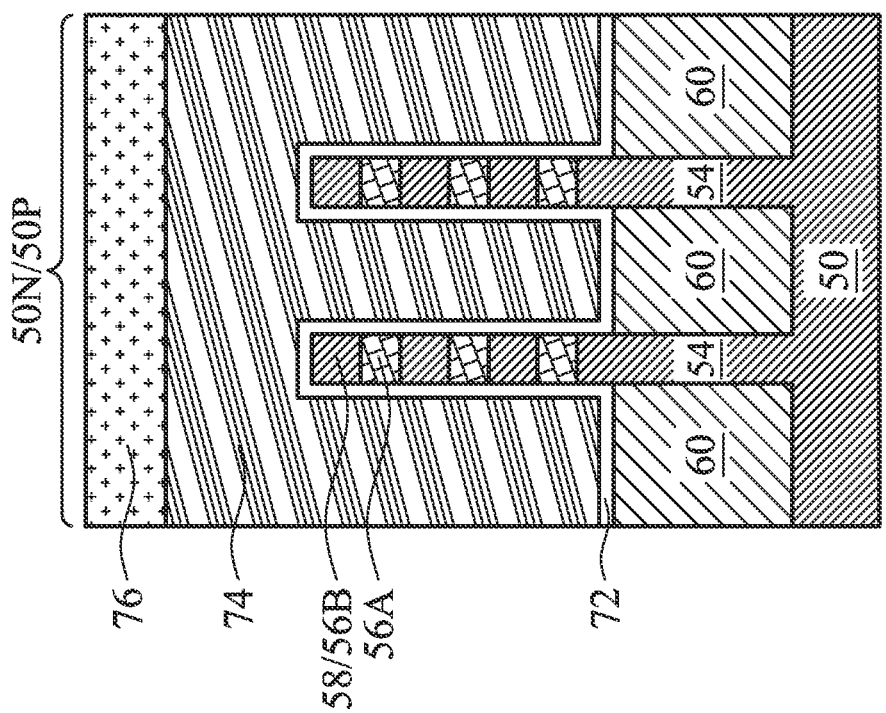

In FIGS. 12A, 12B, and 12C, dummy layers 92 are formed on and around the epitaxial source/drain regions 88. The dummy layers 92 are wrapped around four sides (e.g., top surfaces, sidewalls, and bottom surfaces) of the epitaxial source/drain regions 88A and are wrapped around three sides (e.g., top surfaces and sidewalls) of the epitaxial source/drain regions 88B. Specifically, a dummy layer 92 is formed around each group of epitaxial source/drain regions 88 disposed between neighboring dummy gates 74. The dummy layers 92 fill the remaining portions of the source/drain openings 84 that are not filled by the epitaxial source/drain regions 88. The dummy layers 92 may be formed of a dielectric material such as silicon carbonitride, silicon oxynitride, or silicon oxycarbonitride, although other suitable dielectric materials may be utilized. Notably, the dummy layers 92 are formed of a dielectric material that has a high etching selectivity from the etching of a subsequently formed ILD. The dummy layers 92 are so named because they will be removed in a subsequent process for forming source/drain contacts through the subsequently formed ILD. The dummy layers 92 may be deposited by a conformal deposition process, such as ALD, CVD, or the like.

As an example to form the dummy layers 92, the dielectric material of the dummy layers 92 may be conformally deposited around the epitaxial source/drain regions 88 and over the gate spacers 80 and the masks 76, such as by ALD. A removal process is then applied to remove excess of the dielectric material over the gate spacers 80 and the masks 76. In some embodiments, a planarization process such as a chemical mechanical polish (CMP), an etch-back process, combinations thereof, or the like may be utilized. The planarization process exposes the gate spacers 80 and the masks 76 such that top surfaces of the dielectric material, the gate spacers 80, and the masks 76 are coplanar (within process variations) after the planarization process is complete. The dielectric material is then recessed to form the dummy layers 92. The top surfaces of the dummy layers 92 are recessed below the top surfaces of the masks 76, and can be recessed below the top surfaces of the dummy gates 74.

Figure 13A:
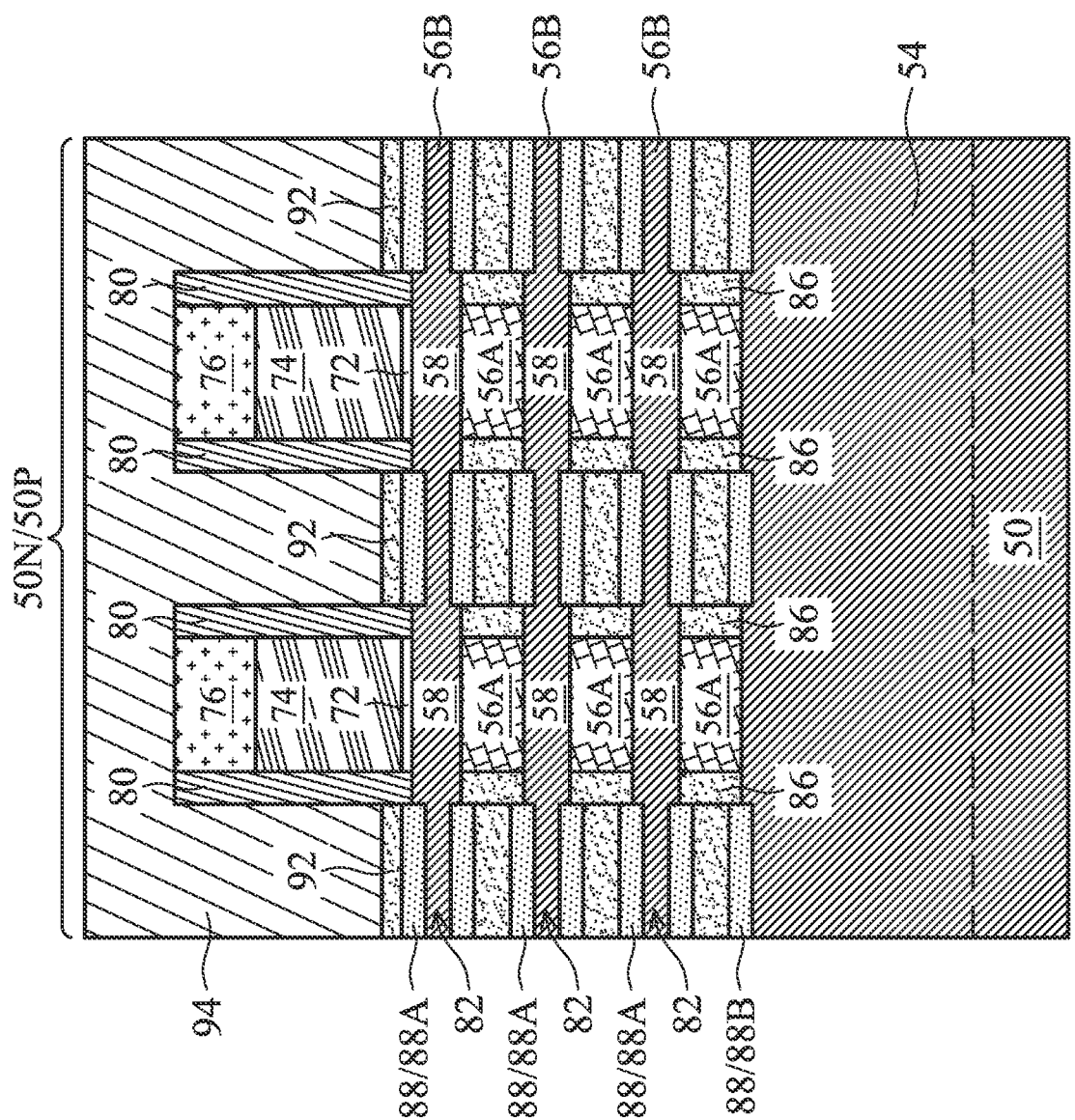
Figure 13C:
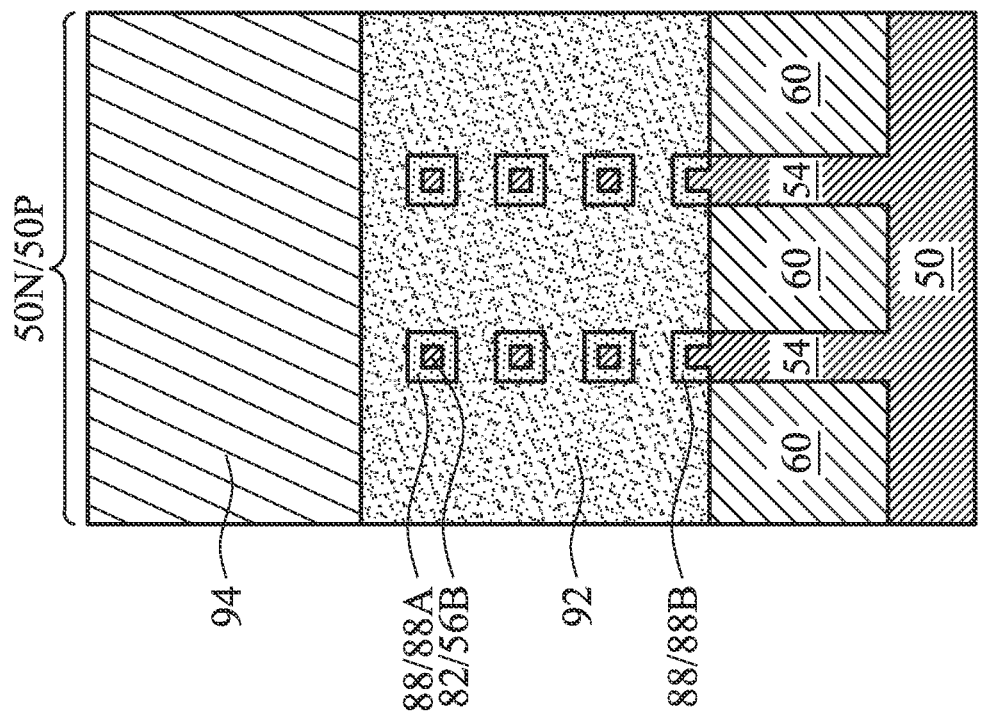
Figure 13B:
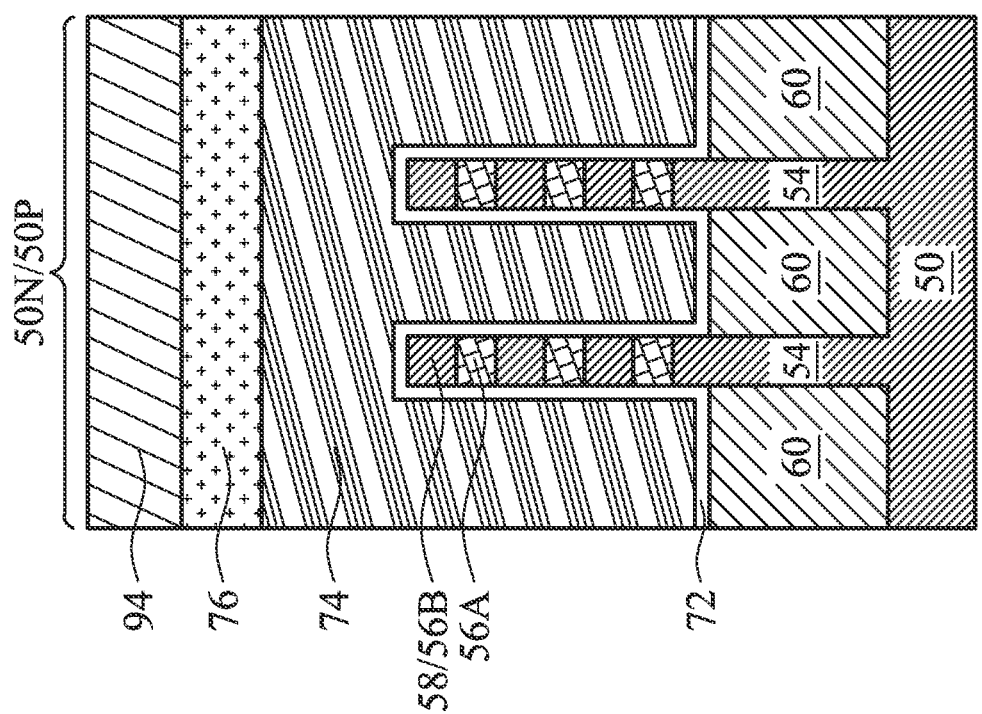

In FIGS. 13A, 13B, and 13C, a first ILD 94 is deposited over the dummy layers 92, the gate spacers 80, and the masks 76. The first ILD 94 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, an etch stop layer is formed between the dummy layers 92 and the first ILD 94. The etch stop layer may include a dielectric material, such as silicon nitride, silicon oxide, silicon oxynitride, or the like, having a different etch rate than the material of the first ILD 94.

Figure 14A:
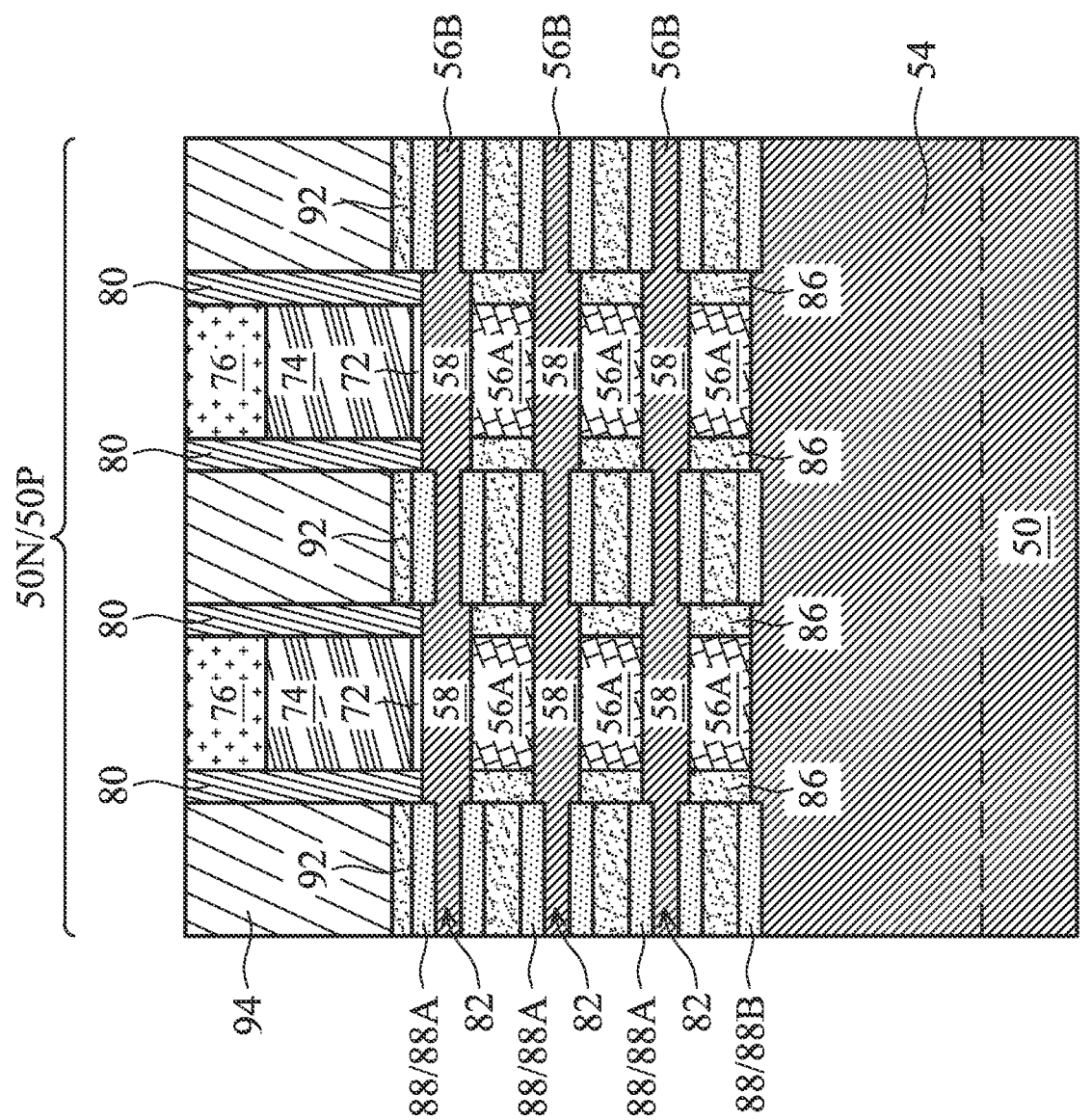
Figure 14C:
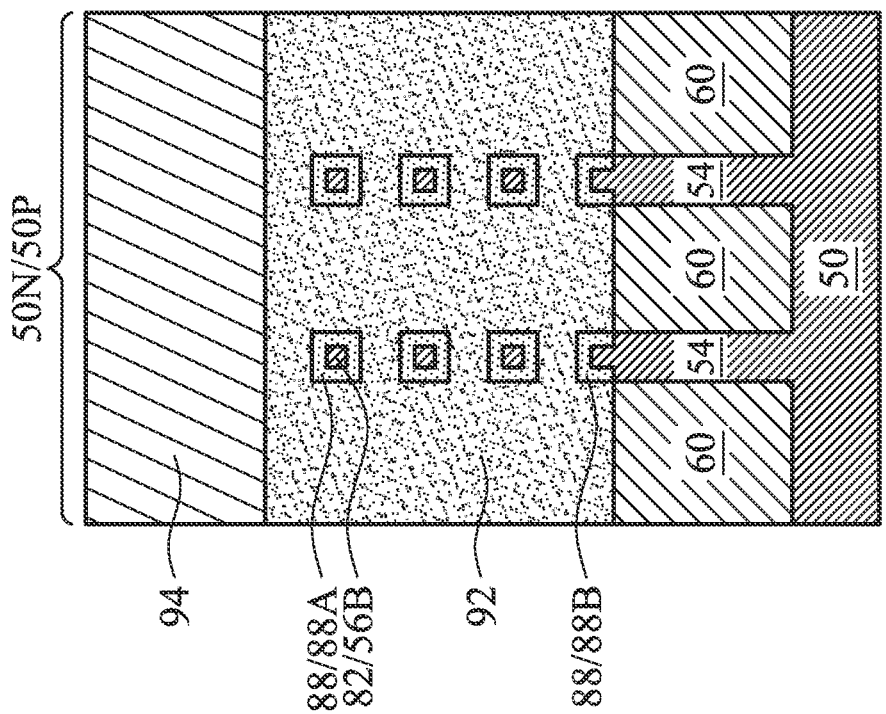
Figure 14B:
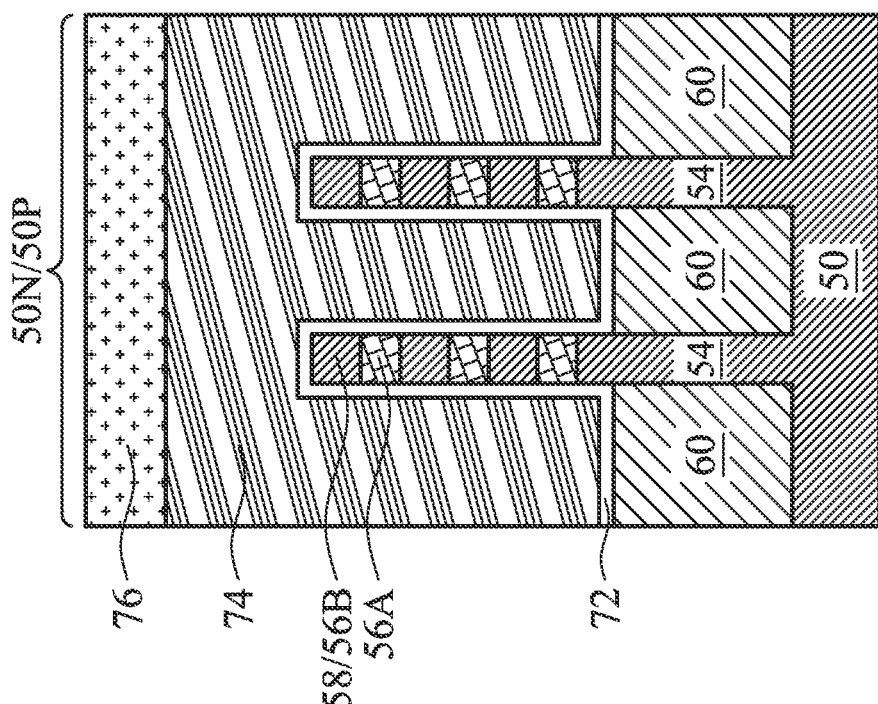

In FIGS. 14A, 14B, and 14C, a planarization process, such as a CMP, may be performed to level the top surface of the first ILD 94 with the top surfaces of the dummy gates 74 or the masks 76. The planarization process may also remove the masks 76 on the dummy gates 74, and portions of the gate spacers 80 along sidewalls of the masks 76. After the planarization process, the top surfaces of the first ILD 94, the gate spacers 80, and the masks 76 (if present) or the dummy gates 74 are coplanar (within process variations). Accordingly, the top surfaces of the masks 76 (if present) or the dummy gates 74 are exposed through the first ILD 94. In the illustrated embodiment, the masks 76 remain, and the planarization process levels the top surface of the first ILD 94 with the top surfaces of the masks 76.

Figure 15A:
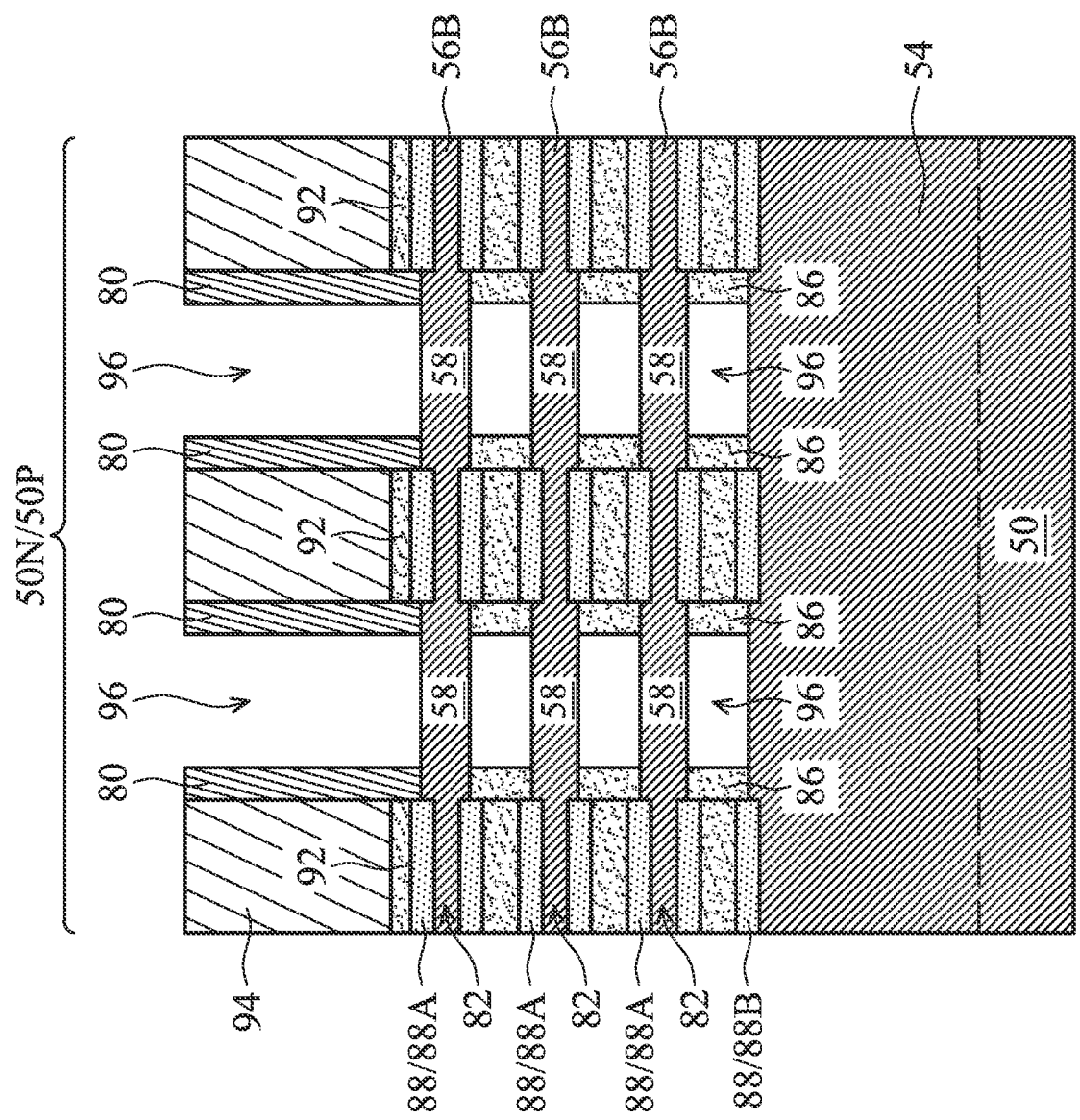
Figure 15B:
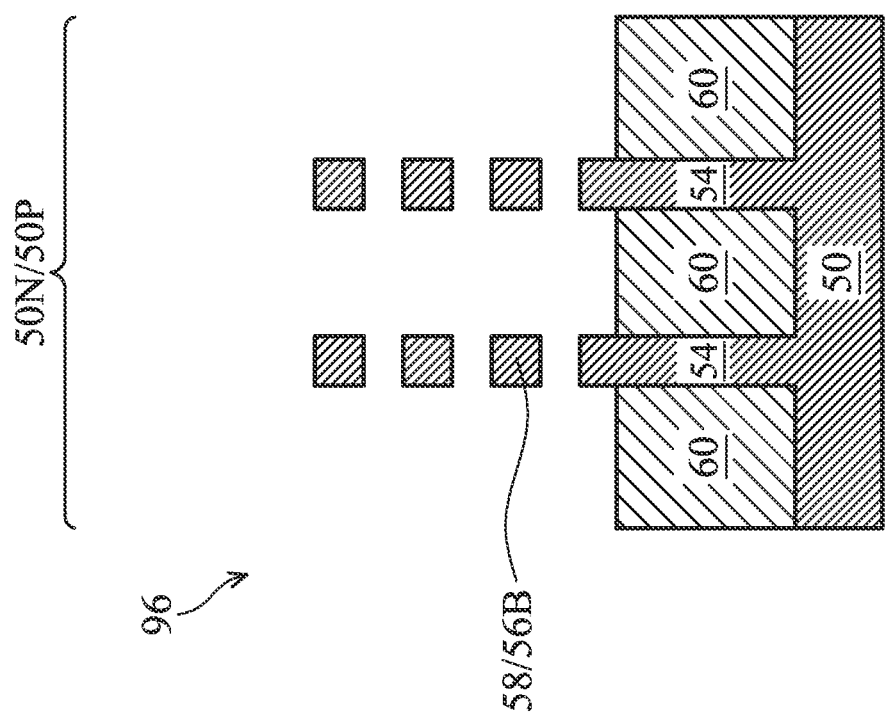
Figure 15C:
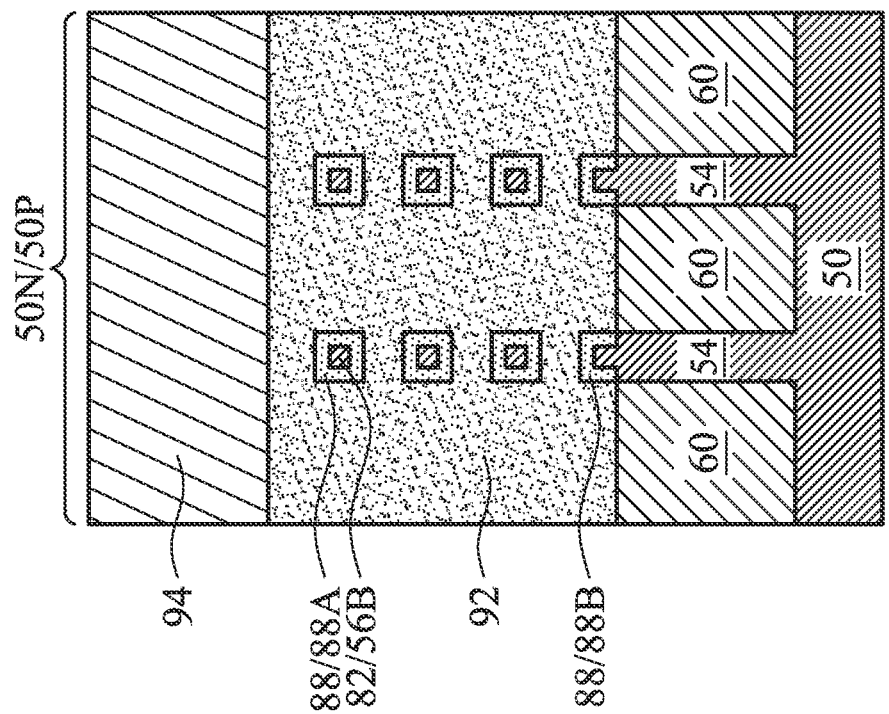

In FIGS. 15A, 15B, and 15C, the masks 76 (if present) and the dummy gates 74 are removed in an etching process, so that recesses 96 are formed. Portions of the dummy dielectrics 72 in the recesses 96 may also be removed. In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 80. During the removal, the dummy dielectrics 72 may be used as etch stop layers when the dummy gates 74 are etched. The dummy dielectric dielectrics 72 may then be removed after the removal of the dummy gates 74. Each recess 96 exposes and/or overlies portions of the channel regions 58 in the second nanostructures 56B. Portions of the second nanostructures 56B which act as the channel regions 58 are disposed between neighboring pairs of the epitaxial source/drain regions 88.

The remaining portions of the first nanostructures 56A are then removed to expand the recesses 96. The remaining portions of the first nanostructures 56A can be removed by an acceptable etching process that selectively etches the material of the first nanostructures 56A at a faster rate than the materials of the second nanostructures 56B, the fins 54, and the STI regions 60. The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide ($NH_4OH$), or the like.

Figure 16A:
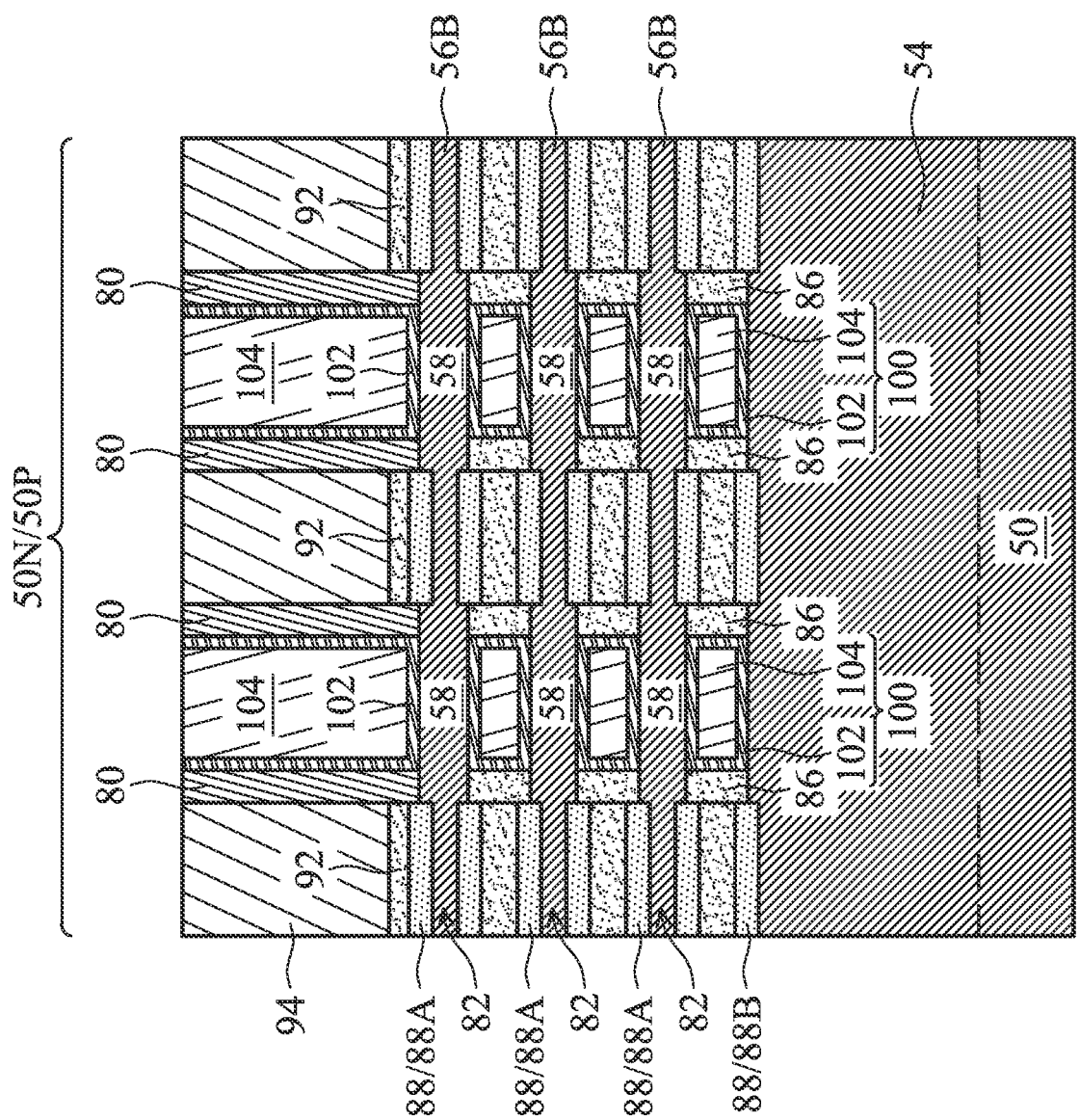
Figure 16C:
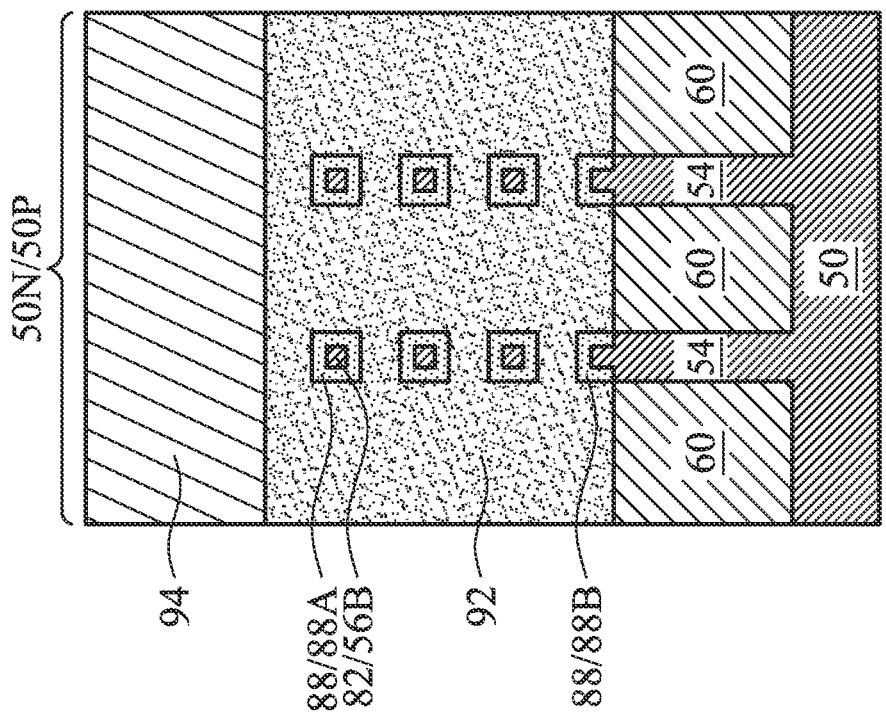
Figure 16B:
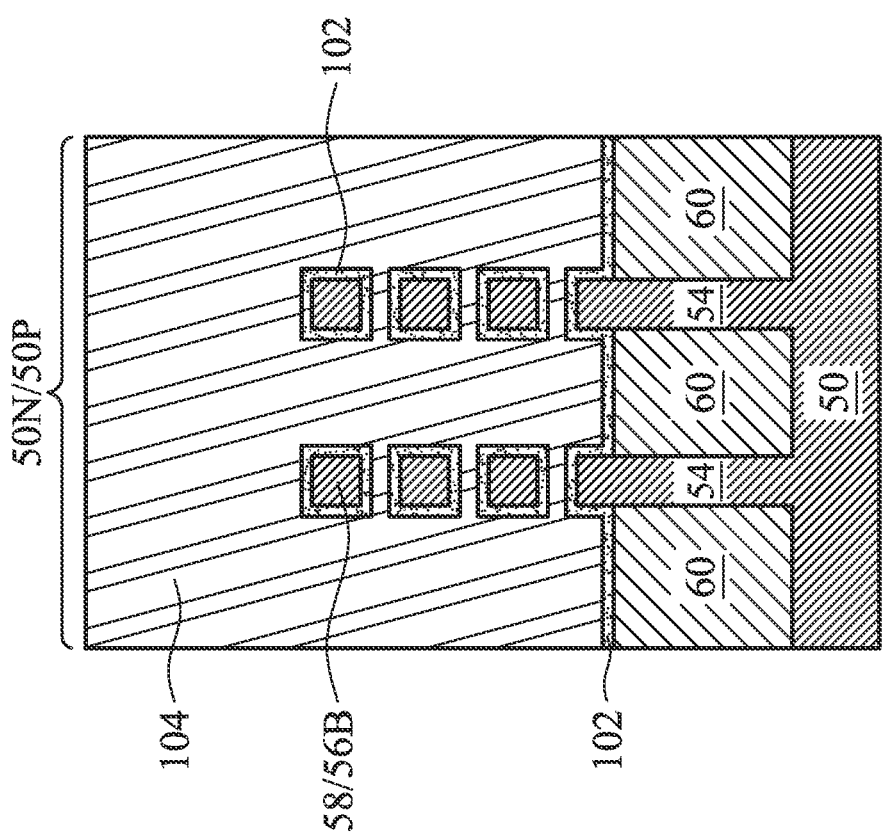

In FIGS. 16A, 16B, and 16C, gate dielectrics 102 and gate electrodes 104 are formed for replacement gates. The gate dielectrics 102 are deposited conformally in the recesses 96, such as on top surfaces and sidewalls of the fins 54 and on top surfaces, sidewalls, and bottom surfaces of the second nanostructures 56B. The gate dielectrics 102 may also be deposited on top surfaces of the first ILD 94, the gate spacers 80, and the STI regions 60. In accordance with some embodiments, the gate dielectrics 102 comprise silicon oxide, silicon nitride, or multilayers thereof. In some embodiments, the gate dielectrics 102 include a high-k dielectric material, and in these embodiments, the gate dielectrics 102 may have a k value greater than about 7.0, and may include a metal oxide or a silicate of hafnium, aluminum, zirconium, lanthanum, manganese, barium, titanium, lead, and combinations thereof. The formation methods of the gate dielectrics 102 may include molecular-beam deposition (MBD), ALD, PECVD, and the like.

The gate electrodes 104 are deposited over the gate dielectrics 102, respectively, and fill the remaining portions of the recesses 96. The gate electrodes 104 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 104 are illustrated, the gate electrodes 104 may comprise any number of liner layers, any number of work function tuning layers, and a fill material. Any combination of the layers which make up the gate electrodes 104 may be deposited in the areas between each of the second nanostructures 56B and between the fins 54 and the second nanostructures 56B. After the filling of the recesses 96, a planarization process, such as a CMP, may be performed to remove the excess portions of the materials of the gate dielectrics 102 and the gate electrodes 104, which excess portions are over the top surface of the first ILD 94 and the gate spacers 80. The remaining portions of the materials of the gate dielectrics 102 and the gate electrodes 104 thus form replacement gates of the resulting nano-FETs. The gate dielectrics 102 and the gate electrodes 104 may be collectively referred to as gate structures 100 or "gate stacks."

The formation of the gate dielectrics 102 in the region 50N and the region 50P may occur simultaneously such that the gate dielectrics 102 in each region are formed from the same materials, and the formation of the gate electrodes 104 may occur simultaneously such that the gate electrodes 104 in each region are formed from the same materials. In some embodiments, the gate dielectrics 102 in each region may be formed by distinct processes, such that the gate dielectrics 102 may be different materials, and/or the gate electrodes 104 in each region may be formed by distinct processes, such that the gate electrodes 104 may be different materials. Various masking steps may be used to mask and expose appropriate regions when using distinct processes.

Figure 17A:
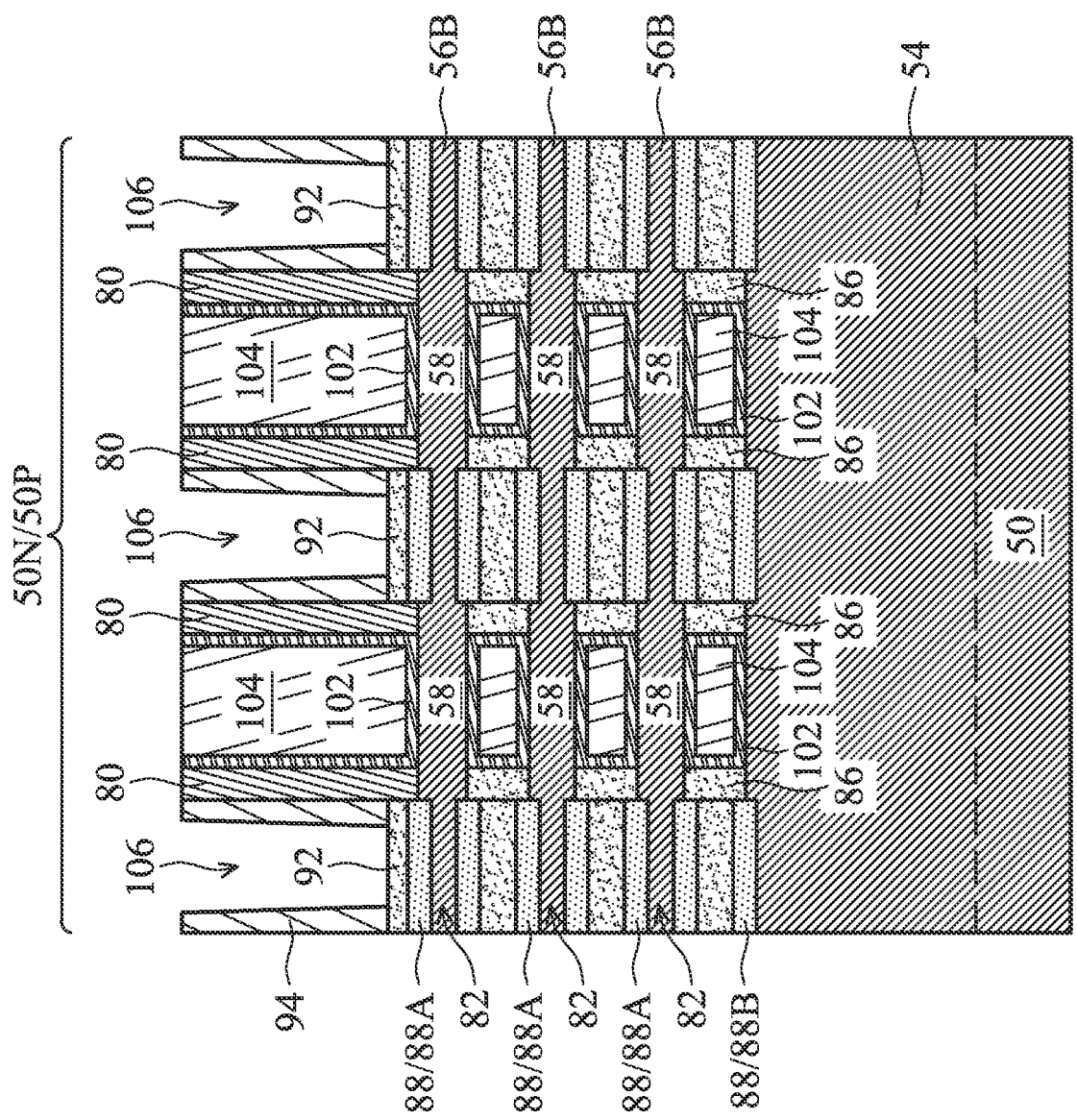

In FIGS. 17A, 17B, and 17C, source/drain contact openings 106 are formed through the first ILD 94. The source/drain contact openings 106 may be formed using acceptable photolithography and etching techniques, such as with an etching process that is selective to the first ILD 94 (e.g., etches the material of the first ILD 94 at a faster rate than the material of the dummy layers 92). During the etching, the dummy layers 92 may be used as etch stop layers so that the source/drain contact openings 106 expose the dummy layers 92.

Figure 18A:
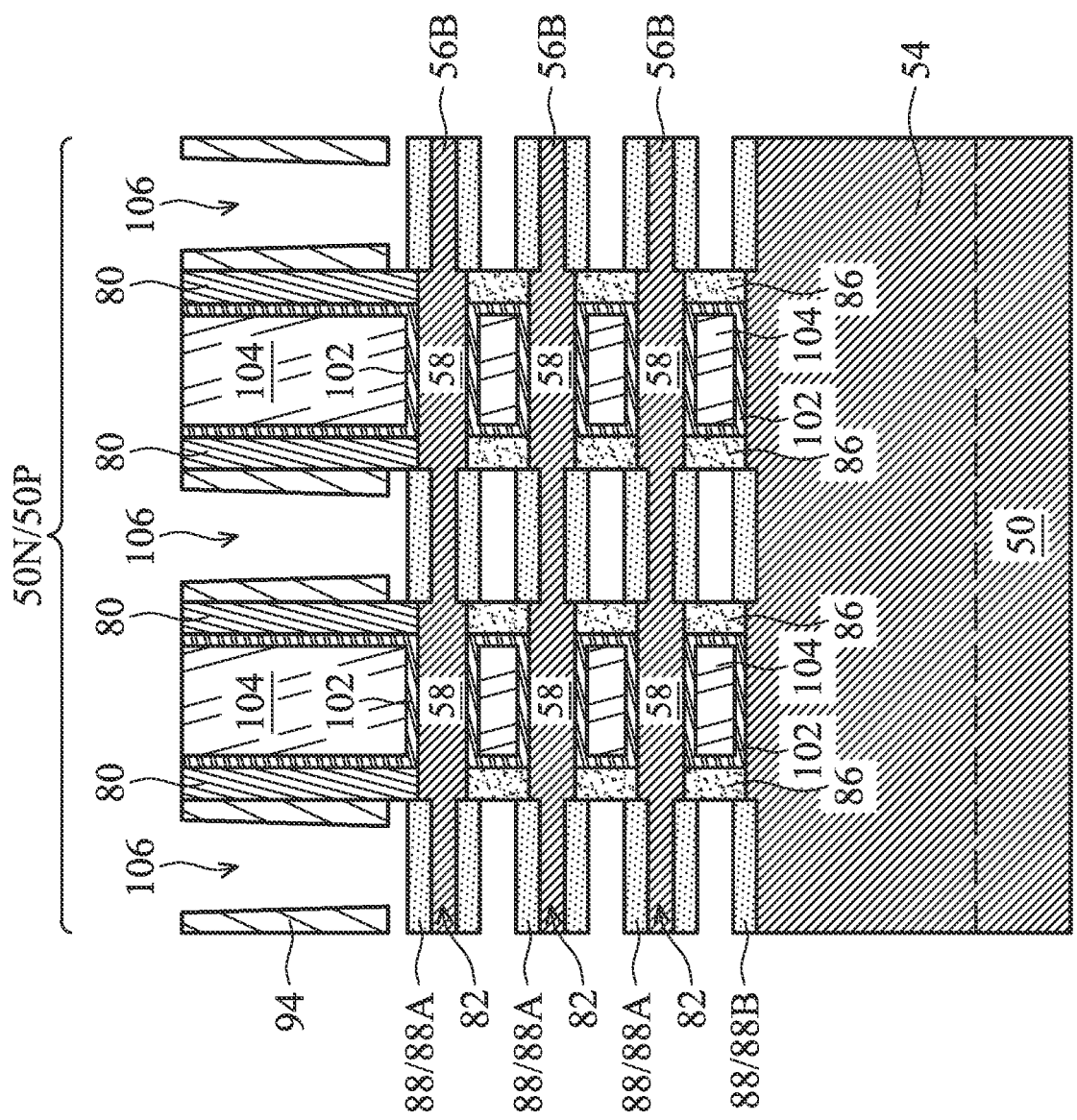

In FIGS. 18A, 18B, and 18C, the dummy layers 92 are removed to expand the source/drain contact openings 106 and expose the epitaxial source/drain regions 88. Removing the dummy layers 92 exposes all the exterior surfaces (e.g., top surfaces, sidewalls, and bottom surfaces) of the epitaxial source/drain regions 88. The dummy layers 92 may be removed using an acceptable etching process, such as one that is selective to the dummy layers 92 (e.g., etches the material of the dummy layers 92 at a faster rate than the material of the first ILD 94).

Figure 19A:
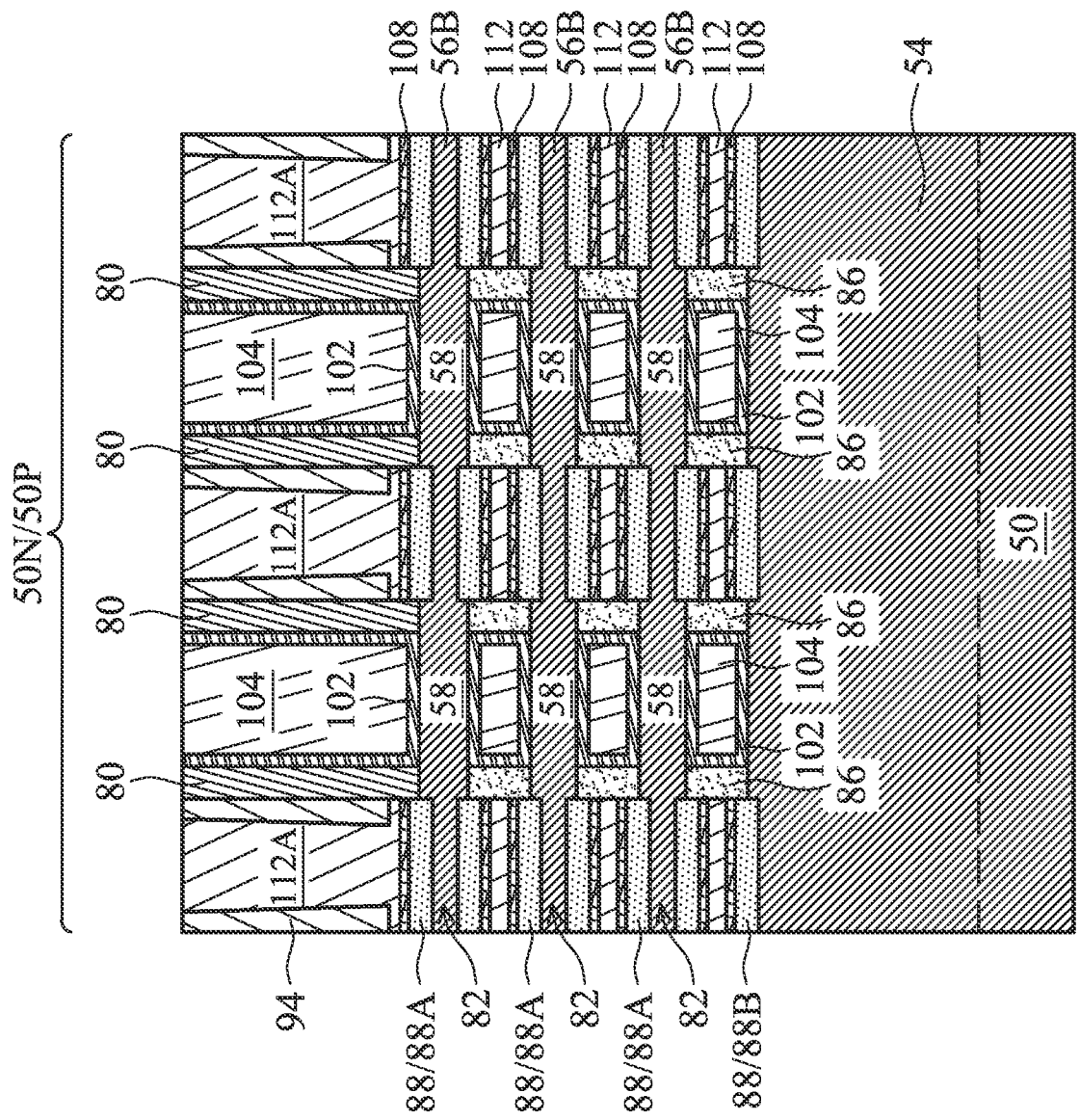
Figure 19C:
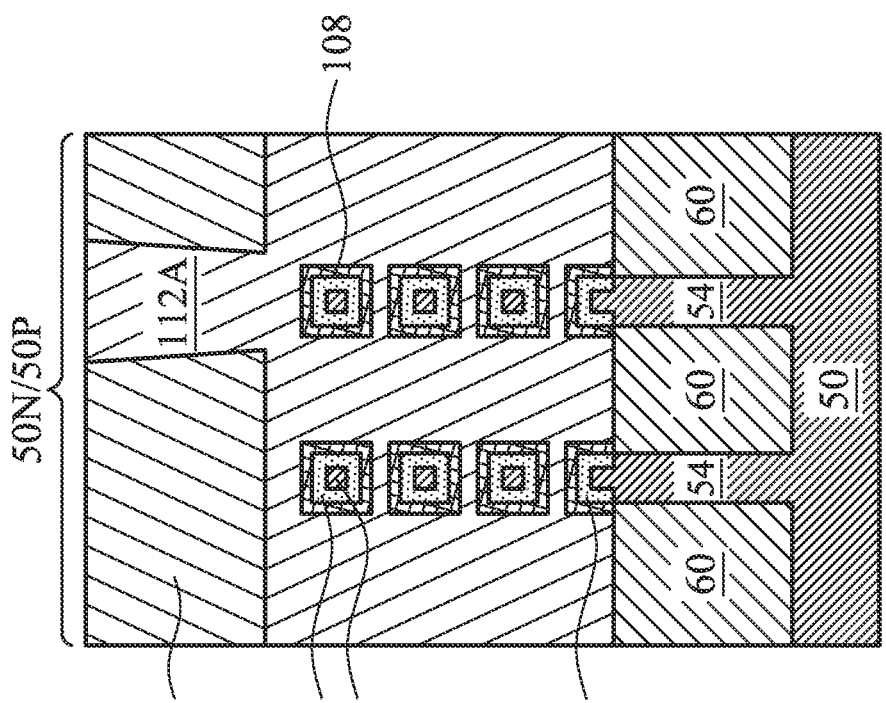
Figure 19B:
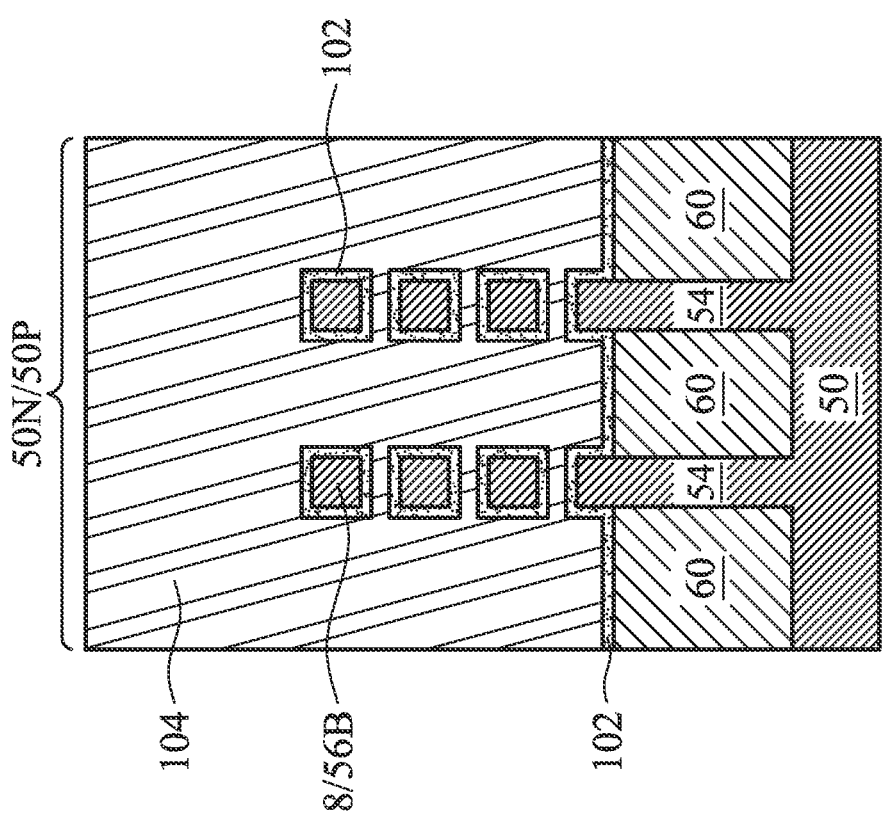

In FIGS. 19A, 19B, and 19C, silicides 108 are formed in the source/drain contact openings 106 and on the epitaxial source/drain regions 88. The silicides 108 are wrapped around the epitaxial source/drain regions 88. The silicides 108 may be formed by depositing a metal layer in the source/drain contact openings 106 and performing an anneal process. The metal layer may be conformally formed on the top surfaces of the first ILD 94, the sidewalls of the first ILD 94, and all of the surfaces (e.g., top surfaces, sidewalls, and bottom surfaces) of the epitaxial source/drain regions 88. The metal layer may formed of titanium, cobalt, tungsten, or the like, and may be deposited by any suitable method, such as ALD, PVD, CVD, and PECVD. In some embodiments, a liner is also formed in the source/drain contact openings 106. The liner may be a diffusion barrier layer, an adhesion layer, or the like, and may help prevent the metal layer from diffusing into the first ILD 94 during annealing. The liner may include titanium, titanium nitride, tantalum, tantalum nitride, or the like. The metal layer and optionally the liner are then annealed to form the silicides 108. The silicides 108 are physically and electrically coupled to the epitaxial source/drain regions 88. Excess portions of the metal layer and/or the liner may then be removed by an acceptable etching process.

Lower source/drain contacts 112A are then formed in the source/drain contact openings 106. A liner, such as a diffusion barrier layer, an adhesion layer, or the like, and a conductive material are formed in the source/drain contact openings 106. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be copper, a copper alloy, silver, gold, tungsten, cobalt, aluminum, nickel, or the like. The conductive material may be deposited by ALD, CVD, PVD, or the like. A planarization process, such as a CMP, may be performed to remove excess material from a surface of the first ILD 94. The remaining liner and conductive material in the source/drain contact openings 106 forms the lower source/drain contacts 112A. The lower source/drain contacts 112A are physically and electrically coupled to the silicides 108.

Figure 20A:
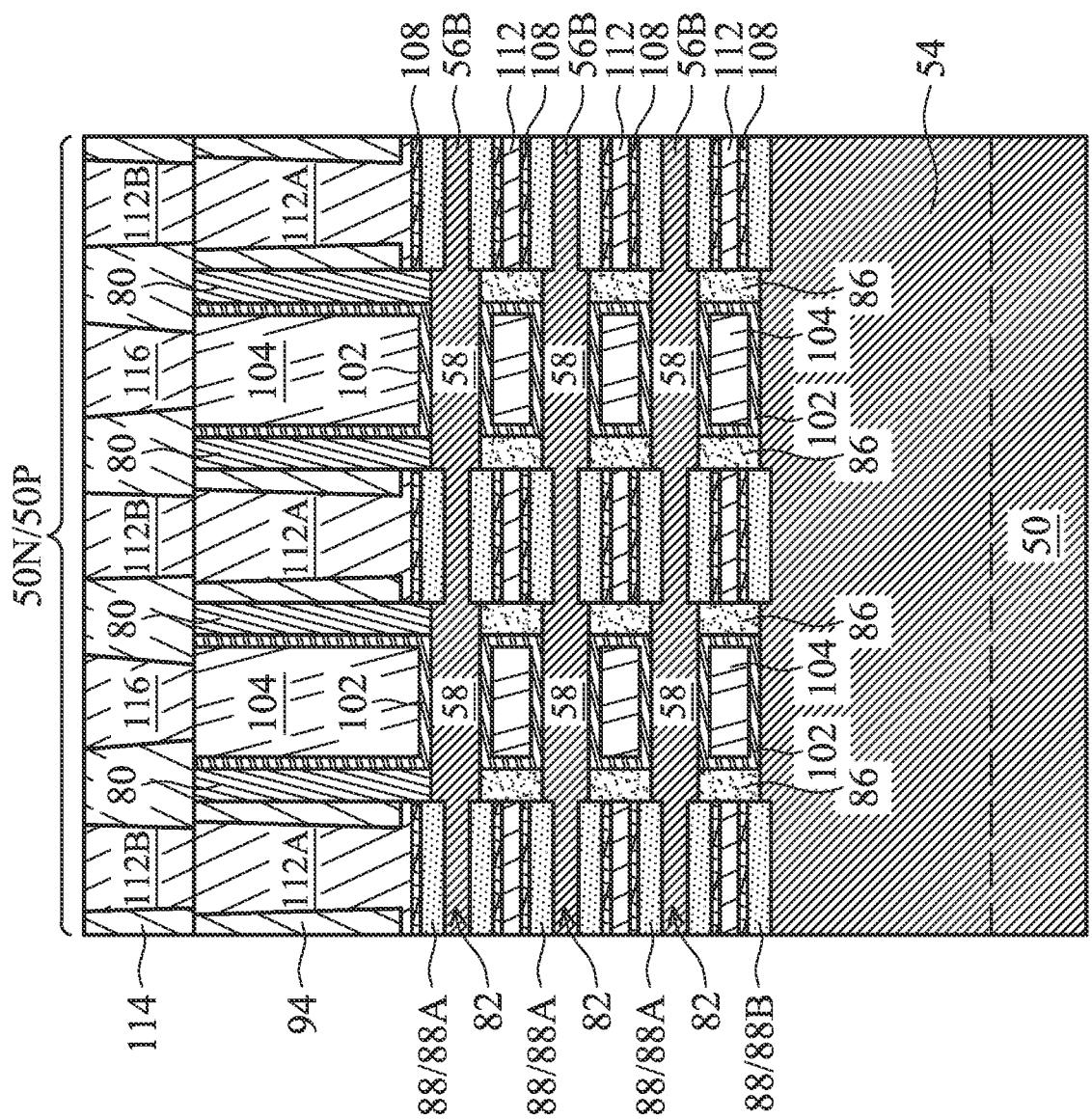
Figure 20C:
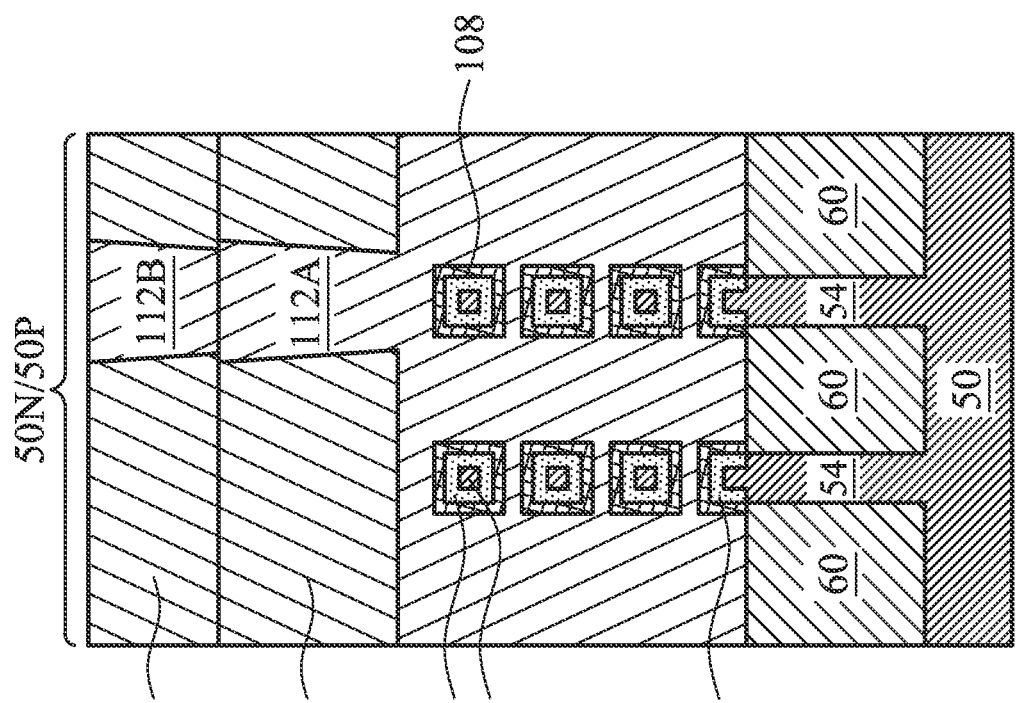
Figure 20B:
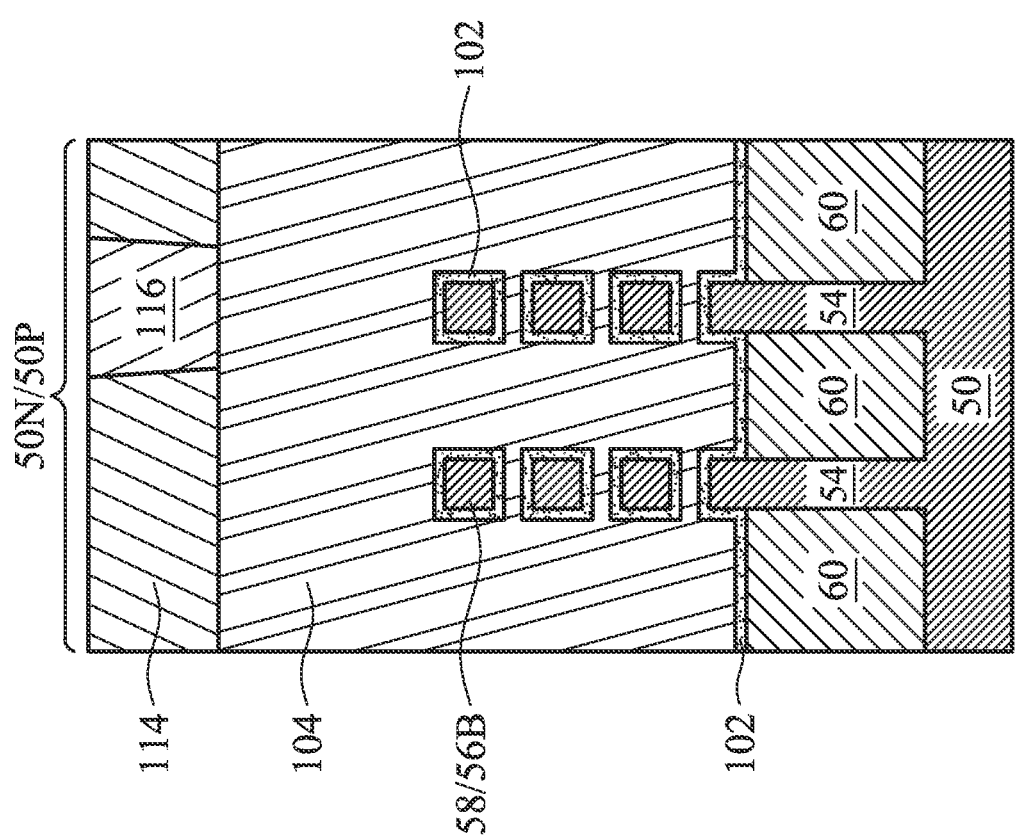

In FIGS. 20A, 20B, and 20C, a second ILD 114 is deposited over the first ILD 94. The second ILD 114 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. After formation, the second ILD 114 can be planarized, such as by a CMP. In some embodiments, an etch stop layer is formed between the first ILD 94 and the second ILD 114. The etch stop layer may include a dielectric material, such as silicon nitride, silicon oxide, silicon oxynitride, or the like, having a different etch rate than the material of the second ILD 114.

Upper source/drain contacts 112B and gate contacts 116 are then formed extending through the second ILD 114. Openings for the upper source/drain contacts 112B and the gate contacts 116 are formed through the second ILD 114. The openings may be formed using acceptable photolithography and etching techniques. A liner, such as a diffusion barrier layer, an adhesion layer, or the like, and a conductive material are formed in the opening. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be copper, a copper alloy, silver, gold, tungsten, cobalt, aluminum, nickel, or the like. The conductive material may be deposited by ALD, CVD, PVD, or the like. A planarization process, such as a CMP, may be performed to remove excess material from a surface of the second ILD 114. The remaining liner and conductive material in the source/drain contact openings 106 forms the upper source/drain contacts 112B and the gate contacts 116. The upper source/drain contacts 112B are physically and electrically coupled to the lower source/drain contacts 112A, and the gate contacts 116 are physically and electrically coupled to the gate electrodes 104. The upper source/drain contacts 112B and the lower source/drain contacts 112A may be collectively referred to as source/drain contacts 112. After formation, the lower source/drain contacts 112A physically contact the gate spacers 80 and the inner spacers 86, and have portions disposed between the epitaxial source/drain regions 88 of a same column. In this embodiment, the source/drain contacts 112 include first conductive features (e.g., the lower source/drain contacts 112A) extending through the first ILD 94, and include second conductive features (e.g., the upper source/drain contacts 112B) extending through the second ILD 114.

The source/drain contacts 112 and the gate contacts 116 may be formed in different processes, or may be formed in the same process. Although the source/drain contacts 112 and the gate contacts 116 are illustrated in the same cross-section, the contacts may be formed in different cross-sections, which may avoid shorting of the contacts.

Figure 21:
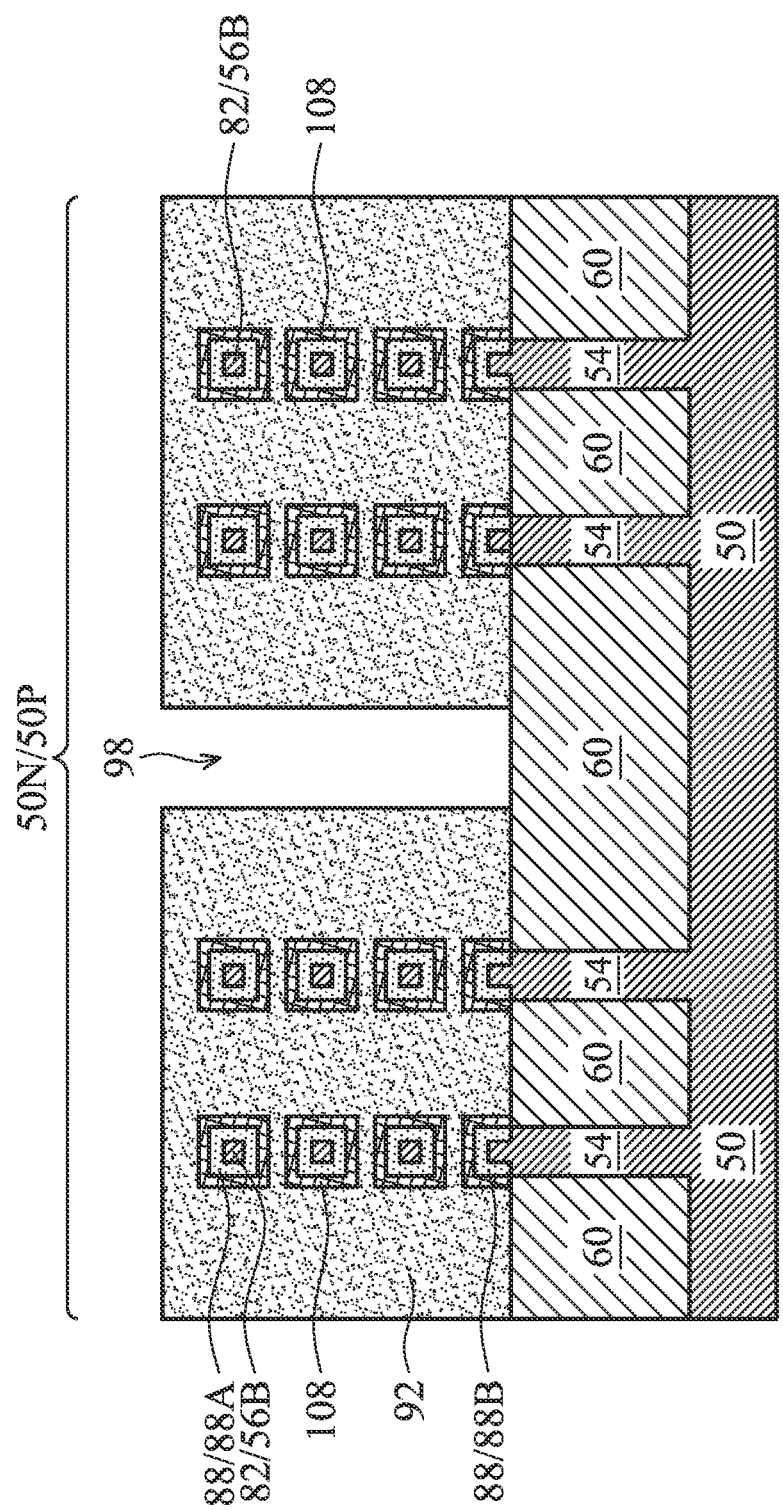
FIGS. 21 through 23 are cross-sectional views of intermediate stages in the manufacturing of nano-FETs, in accordance with some embodiments.
Figure 22:
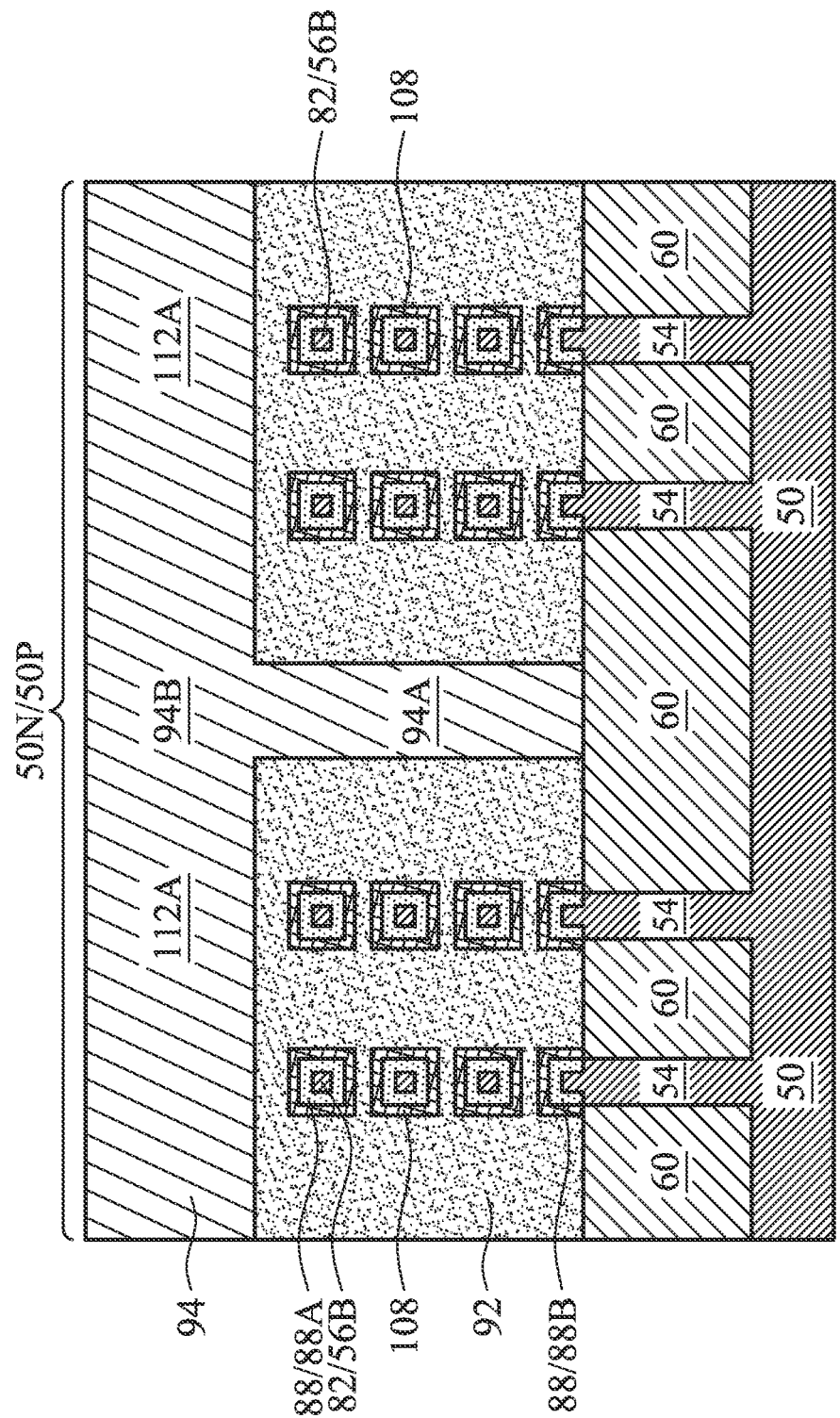
Figure 23:
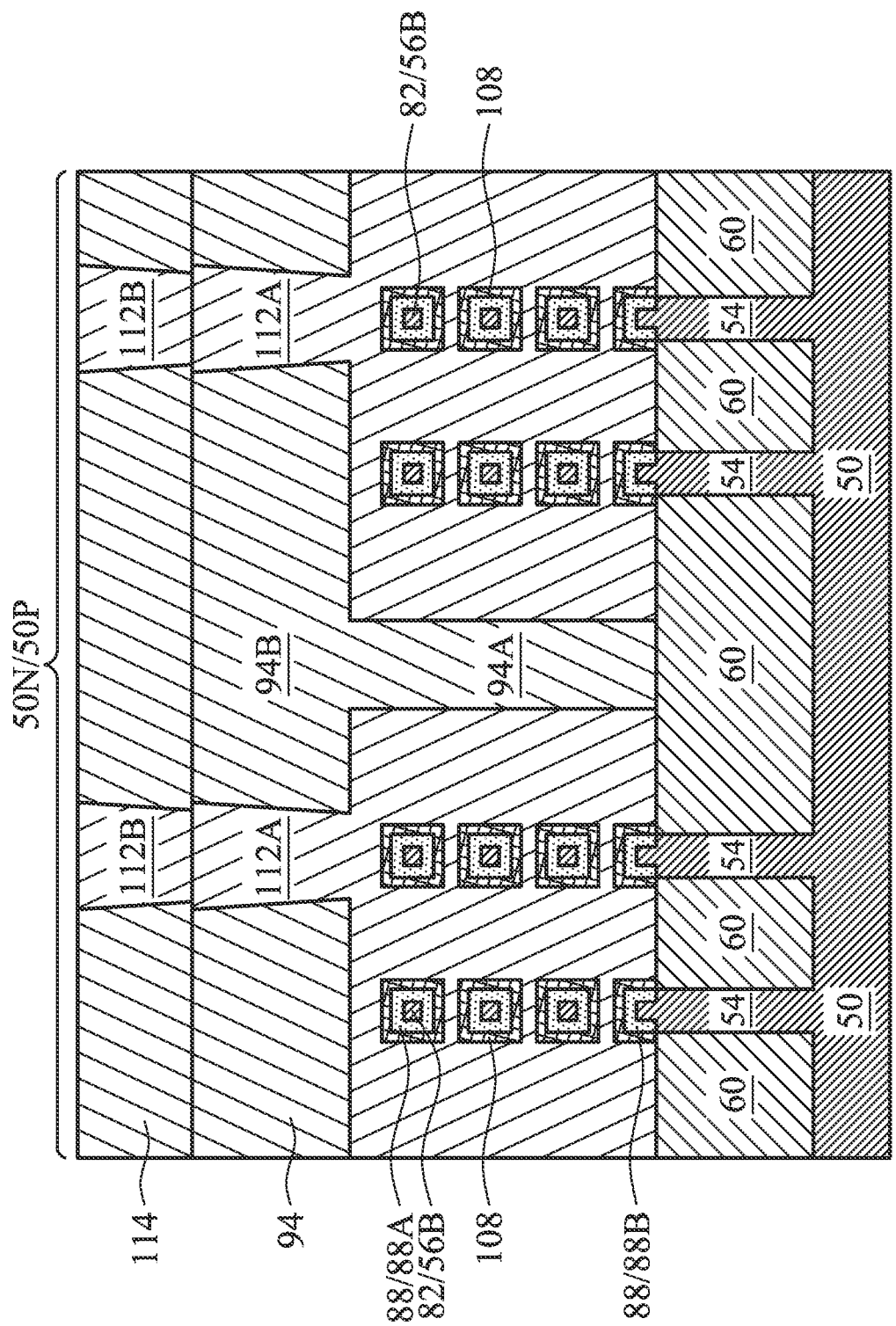

FIGS. 21 through 23 are cross-sectional views of intermediate stages in the manufacturing of nano-FETs, in accordance with some embodiments. As will be discussed in greater detail below, FIGS. 21 through 23 illustrate a contact cut process, where adjacent lower source/drain contacts 112A are separated from one another by forming a dielectric feature between the adjacent lower source/drain contacts 112A. FIGS. 21 through 23 are illustrated along reference cross-section C-C in FIG. 1, except four fins are shown. FIGS. 7A through 20C may be applicable to both the n-type region 50N and the p-type region 50P. Differences (if any) in the structures of the n-type region 50N and the p-type region 50P are described in the text accompanying each figure.

In FIG. 21, a structure at a similar state of processing as that described with respect to FIG. 12C is obtained. FIG. 21 illustrates a first group of the fins 54 (e.g., at the left-hand side of the page) and a second group of the fins 54 (e.g., at the right-hand side of the page) over the substrate 50. Each group of the fins 54 may be used to form a nano-FET. A cut opening 98 is formed in the dummy layer 92. The cut opening 98 may be formed using acceptable photolithography and etching techniques. After formation, the cut opening 98 exposes underlying insulation materials, e.g., the STI regions 60. The cut opening 98 is formed between the first group and the second group of the fins 54, and defines where a dielectric feature will be formed between subsequently formed source/drain contacts to the nano-FET.

In FIG. 22, the first ILD 94 is formed and planarized, using a similar process as that described with respect to FIGS. 13A through 14C. The first ILD 94 is formed in the cut opening 98 and above the dummy layer 92. Thus, the first ILD 94 includes a lower region 94A (e.g., in the cut opening 98) and an upper region (e.g., above the dummy layer 92) 94B.

In FIG. 23, the lower source/drain contacts 112A, the second ILD 114, and the upper source/drain contacts 112B are formed, using a similar process as that described with respect to FIGS. 17A through 20C. After formation, the lower region 94A of the first ILD 94 is thus a dielectric feature that separates the neighboring lower source/drain contacts 112A.

It should be appreciated that FIGS. 21 through 23 illustrate an example contact cut process. Other dielectric features could be formed separating the neighboring lower source/drain contacts 112A. For example, a dielectric feature formed of a different material than the first ILD 94 and the dummy layer 92 may be formed between the neighboring lower source/drain contacts 112A.

In the embodiments described above, neighboring epitaxial source/drain regions 88 (e.g., epitaxial source/drain regions 88 disposed over different fins 54) are electrically coupled with a same source/drain contact 112. In other words, each lower source/drain contact 112A is coupled to multiple columns of epitaxial source/drain regions 88. In another embodiment (discussed in greater detail below), neighboring epitaxial source/drain regions 88 can each be coupled to a different respective source/drain contact 112.

Figure 24:
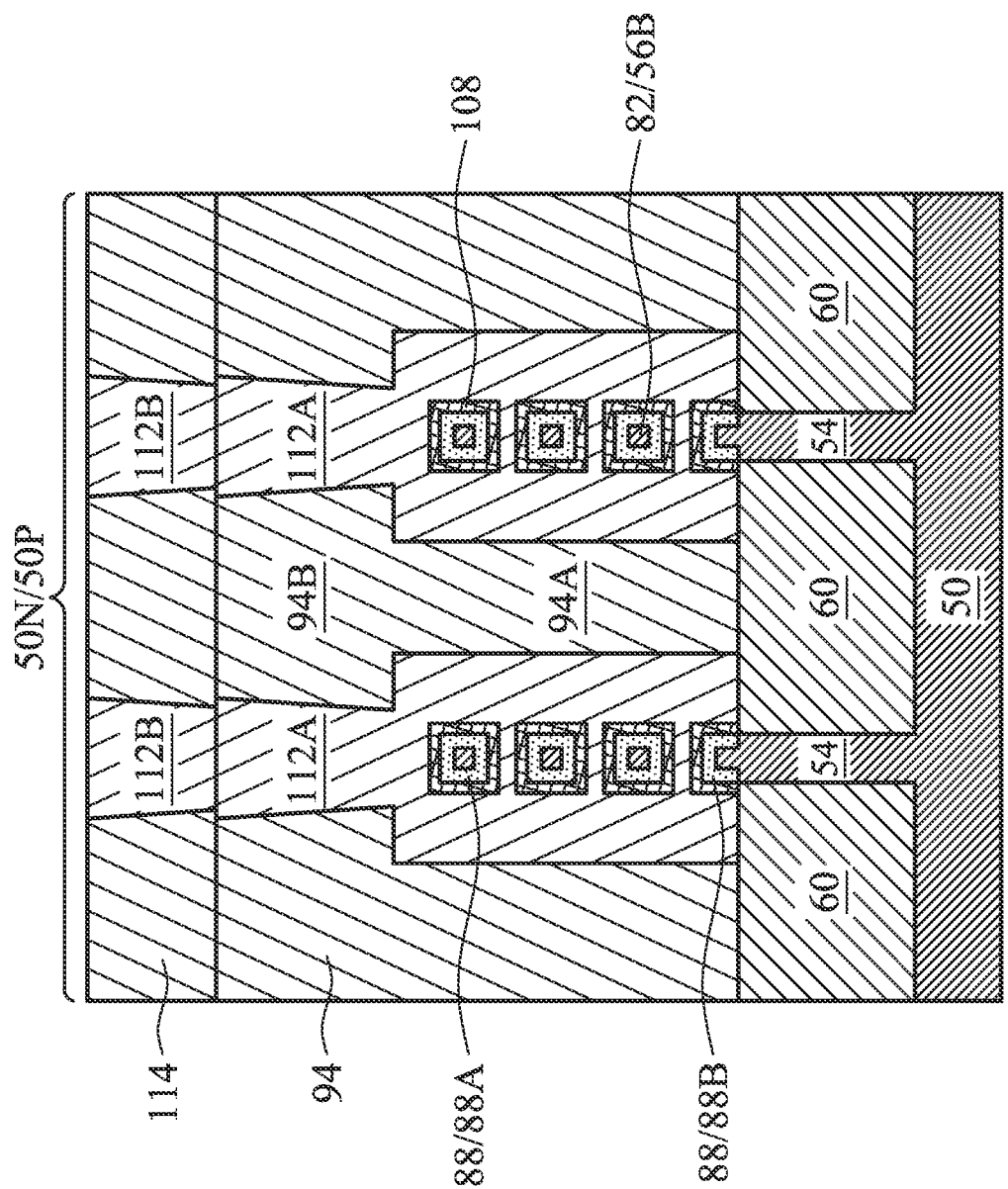
FIG. 24 is a cross-sectional view of nano-FETs, in accordance with some other embodiments.

FIG. 24 is a cross-sectional view of nano-FETs, in accordance with some other embodiments. This embodiment is similar to that described with respect to FIG. 23, except neighboring epitaxial source/drain regions 88 are each coupled to a different lower source/drain contact 112A. In other words, each lower source/drain contact 112A is coupled to one column of epitaxial source/drain regions 88.

Figure 25A:
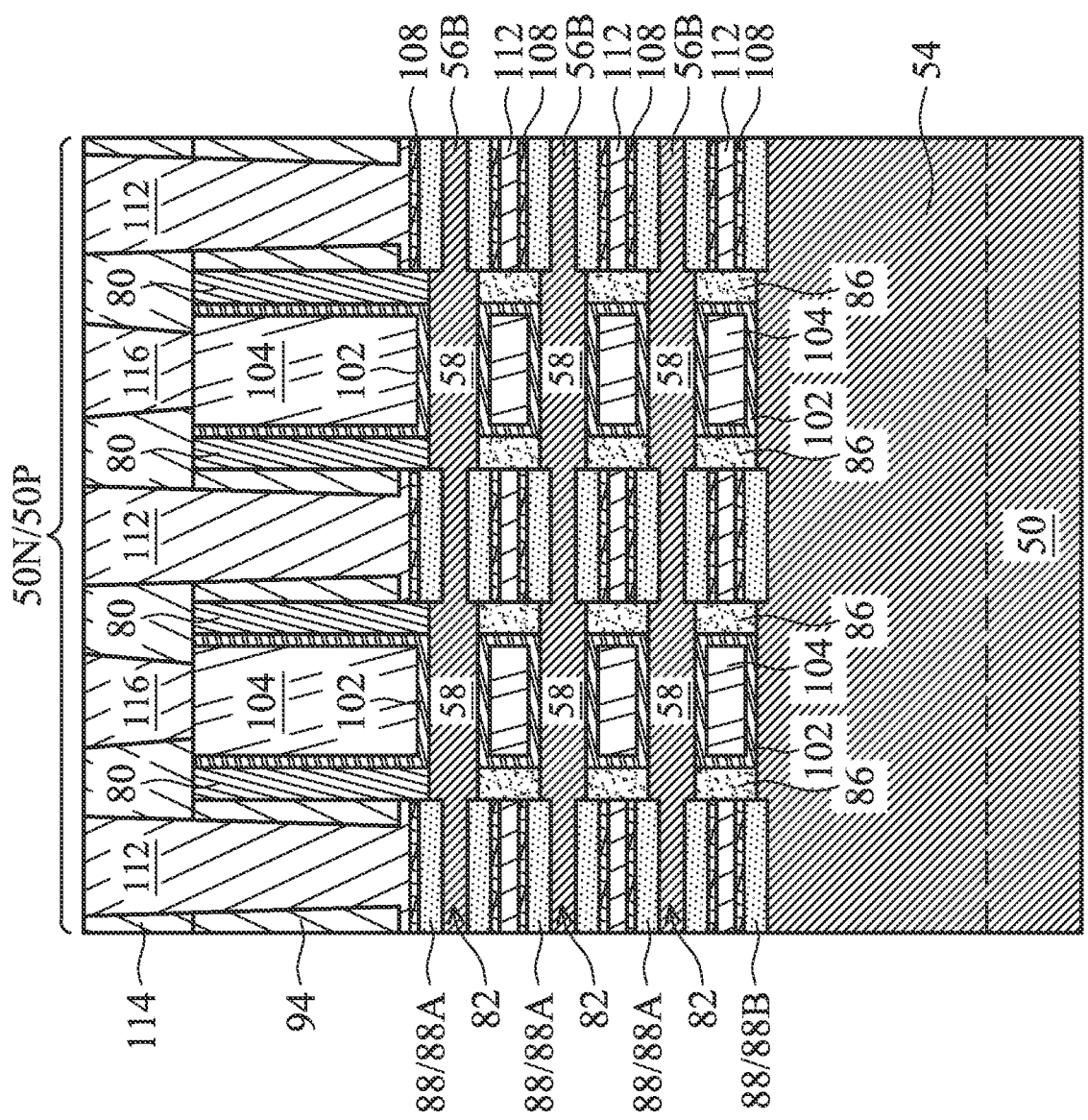
FIGS. 25A, 25B, and 25C are cross-sectional view of nano-FETs, in accordance with some other embodiments.
Figure 25C:
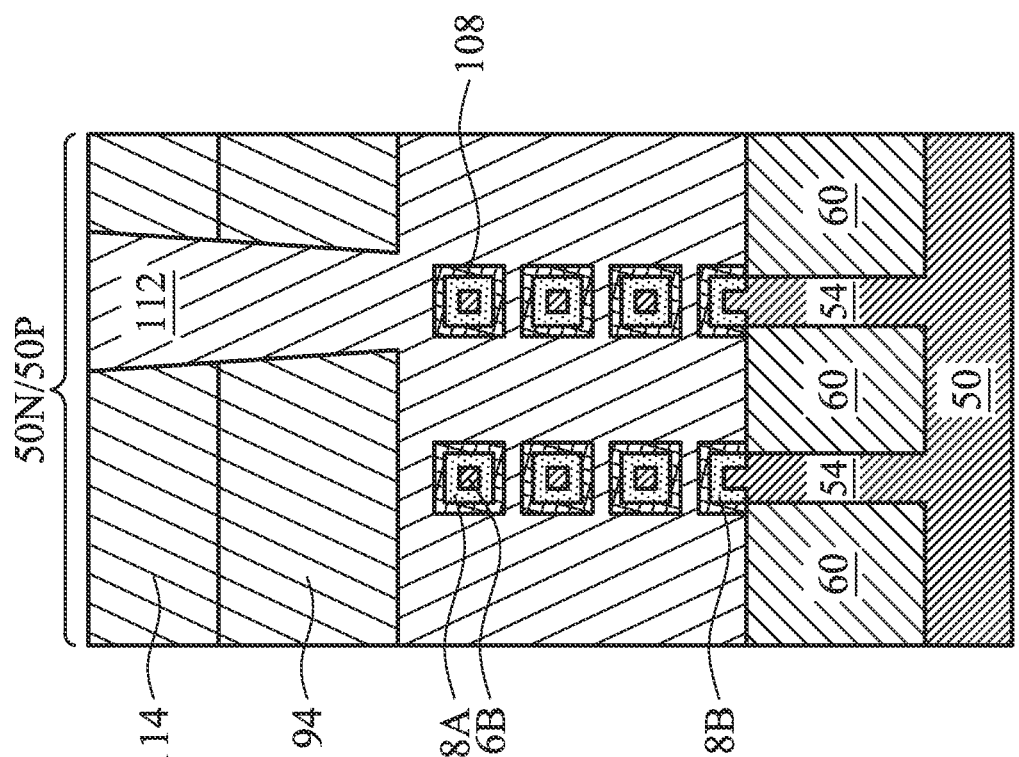
Figure 25B:
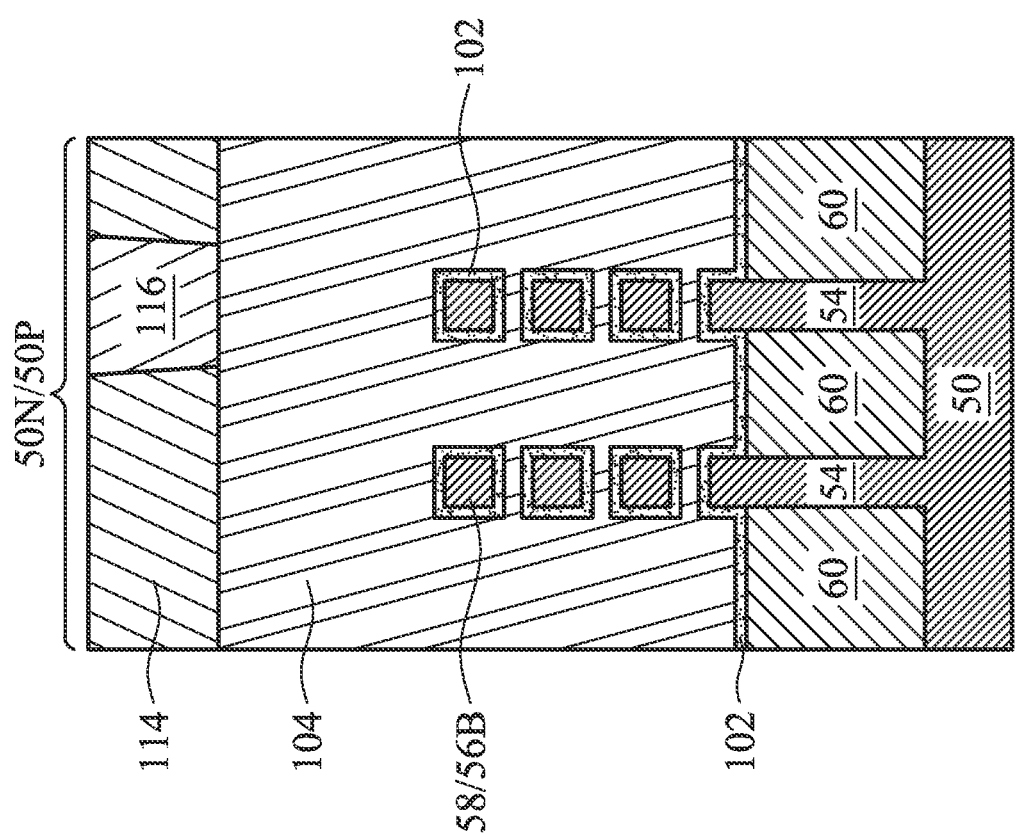

FIGS. 25A, 25B, and 25C are cross-sectional view of nano-FETs, in accordance with some other embodiments. This embodiment is similar to that described with respect to FIGS. 20A, 20B, and 20C, except the source/drain contacts 112 are continuous conductive features that extend through both the first ILD layer 94 and the second ILD layer 114. The nano-FETs according to this embodiment may be formed by obtaining a structure at a similar state of processing as that described with respect to FIGS. 16A, 16B, and 16C, and then forming the second ILD layer 114 over the first ILD layer 94 before forming the source/drain contact openings 106. After the second ILD layer 114 is formed, the source/drain contact openings 106 can be formed through both of the second ILD layer 114 and the first ILD layer 94 and the dummy layers 92 can be removed, using a similar process as that described with respect to FIGS. 17A through 18C. The source/drain contacts 112 can then be formed in the source/drain contact openings 106, using a similar process as that described with respect to FIGS. 19A, 19B, and 19C.

It should be appreciated that the embodiment described with respect to FIGS. 25A, 25B, and 25C could be combined with features from the embodiments described with respect to FIGS. 21 through 24. For example, the source/drain contacts 112 of FIGS. 25A, 25B, and 25C could be coupled to one or multiple columns of epitaxial source/drain regions 88. Likewise, a contact cut process could be performed on the source/drain contacts 112 of FIGS. 25A, 25B, and 25C.

Embodiments may achieve advantages. Forming the source/drain contacts 112 by forming and removing the dummy layers 92 allows the source/drain contacts 112 to extend around all (e.g., four) sides of the epitaxial source/drain regions 88. The contact area for the source/drain contacts 112 can thus be increased, reducing the contact resistance ($R_C$) of the source/drain contacts 112 and improving the performance of the nano-FETs. Specifically, the source/drain contacts 112 can have a similar contact resistance for the epitaxial source/drain regions 88 that are disposed proximate to the substrate 50 and the epitaxial source/drain regions 88 that are disposed distal the substrate 50.

In an embodiment, a method includes: patterning a plurality of semiconductor layers to form a first nanostructure, a second nanostructure, and a third nanostructure, the second nanostructure disposed between the first nanostructure and the third nanostructure; doping a first region of the second nanostructure with an impurity while covering a second region of the second nanostructure; removing portions of the first nanostructure and the third nanostructure to expose the top and the bottom of the first region of the second nanostructure; growing an epitaxial source/drain region around the top and the bottom of the first region of the second nanostructure; and forming a gate stack around the top and the bottom of the second region of the second nanostructure. In some embodiments, the method further includes: before growing the epitaxial source/drain region, trimming the first region of the second nanostructure to reduce a thickness of the first region of the second nanostructure. In some embodiments of the method, after trimming the first region of the second nanostructure, the thickness of the first region of the second nanostructure is less than the thickness of the second region of the second nanostructure. In some embodiments, the method further includes: after growing the epitaxial source/drain region, depositing a dummy layer around the top and the bottom of the epitaxial source/drain region; depositing an interlayer dielectric (ILD) layer on the dummy layer; etching the ILD layer to form a first opening exposing the dummy layer; and etching the dummy layer to expand the first opening and expose the epitaxial source/drain region. In some embodiments, the method further includes: depositing a metal layer in the first opening and around the epitaxial source/drain region; annealing the metal layer to form a silicide around the epitaxial source/drain region; and depositing a conductive material in the first opening to form a source/drain contact around the silicide.

In some embodiments of the method, the dummy layer includes a first dielectric material, the ILD layer includes a second dielectric material, etching the ILD layer includes etching the second dielectric material at a faster rate than the first dielectric material, and etching the dummy layer includes etching the first dielectric material at a faster rate than the second dielectric material. In some embodiments of the method, the first dielectric material is silicon carbonitride and the second dielectric material is silicon oxide. In some embodiments, the method further includes: before depositing the ILD layer, etching a second opening in the dummy layer, where depositing the ILD layer includes depositing a portion of the ILD layer in the second opening. In some embodiments, the method further includes: forming the semiconductor layers over a substrate; patterning the substrate to form a fin, the second nanostructure disposed over the fin; and before growing the epitaxial source/drain region, trimming an upper portion of the fin. In some embodiments of the method, forming the gate stack includes: removing remaining portions of the first nanostructure and the third nanostructure to expose the top and the bottom of the second region of the second nanostructure; depositing a gate dielectric around the top and the bottom of the second region of the second nanostructure; and forming a gate electrode on the gate dielectric.

In an embodiment, a device includes: a first nanostructure over a substrate, the first nanostructure including a channel region and a first lightly doped source/drain (LDD) region, the first LDD region adjacent the channel region; a first epitaxial source/drain region wrapped around four sides of the first LDD region; an interlayer dielectric (ILD) layer over the first epitaxial source/drain region; a source/drain contact extending through the ILD layer, the source/drain contact wrapped around four sides of the first epitaxial source/drain region; and a gate stack adjacent the source/drain contact and the first epitaxial source/drain region, the gate stack wrapped around four sides of the channel region.

In some embodiments of the device, the first LDD region has a first thickness, the channel region has a second thickness, and the second thickness is greater than the first thickness. In some embodiments of the device, the first LDD region and the channel region have a same thickness. In some embodiments, the device further includes: a second nanostructure over the substrate, the second nanostructure including a second LDD region; and a second epitaxial source/drain region wrapped around four sides of the second LDD region, the source/drain contact wrapped around four sides of the second epitaxial source/drain region. In some embodiments, the device further includes: a first spacer disposed between the gate stack and the first epitaxial source/drain region, the source/drain contact physically contacting the first spacer; and a second spacer disposed between the gate stack and the second epitaxial source/drain region, the source/drain contact physically contacting the second spacer. In some embodiments of the device, the source/drain contact has a first portion and a second portion, the first portion extending through the ILD layer, the second portion disposed between the first epitaxial source/drain region and the second epitaxial source/drain region, the second portion having a greater width than the first portion.

In an embodiment, a device includes: a nanostructure over a substrate, the nanostructure including a channel region and a lightly doped source/drain (LDD) region, the LDD region adjacent the channel region, the channel region having a first width and a first thickness in a first cross-section, the LDD region having a second width and a second thickness in a second cross-section, the second width being less than the first width, the second thickness being less than the first thickness, the first cross-section and the second cross-section each being perpendicular to a longitudinal axis of the nanostructure; a gate stack completely surrounding the channel region in the first cross-section; and an epitaxial source/drain region completely surrounding the LDD region in the second cross-section.

In some embodiments, the device further includes: an interlayer dielectric (ILD) layer over the epitaxial source/drain region; and a source/drain contact extending through the ILD layer, the source/drain contact completely surrounding the epitaxial source/drain region in the second cross-section. In some embodiments, the device further includes: a silicide between the source/drain contact and the epitaxial source/drain region, the silicide completely surrounding the epitaxial source/drain region in the second cross-section. In some embodiments, the device further includes: an isolation region over the substrate; and a fin having a first portion and a second portion, the first portion extending through the isolation region, the second portion extending above the isolation region, the nanostructure disposed over the fin, the first portion of the fin having a third width, the second portion of the fin having a fourth width, the second width and the fourth width being less than the third width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a plurality of semiconductor layers to form a first nanostructure, a second nanostructure, and a third nanostructure, the second nanostructure disposed between the first nanostructure and the third nanostructure;
    doping a first region of the second nanostructure with an impurity while covering a second region of the second nanostructure;
    removing portions of the first nanostructure and the third nanostructure to expose a top and a bottom of the first region of the second nanostructure;
    growing an epitaxial source/drain region around the top and the bottom of the first region of the second nanostructure;
    depositing a dummy layer around the top and the bottom of the epitaxial source/drain region, the dummy layer comprising a first dielectric material;
    depositing an interlayer dielectric (ILD) on the dummy layer, the ILD comprising a second dielectric material, the second dielectric material different from the first dielectric material; and
    forming a gate stack around the top and the bottom of the second region of the second nanostructure.

2. The method of claim 1 further comprising:
    before growing the epitaxial source/drain region, trimming the first region of the second nanostructure to reduce a thickness of the first region of the second nanostructure.

3. The method of claim 2, wherein after trimming the first region of the second nanostructure, the thickness of the first region of the second nanostructure is less than the thickness of the second region of the second nanostructure.

4. The method of claim 1 further comprising:
etching the ILD to form a first opening exposing the dummy layer; and
etching the dummy layer to expand the first opening and expose the epitaxial source/drain region.

5. The method of claim 4 further comprising:
depositing a metal layer in the first opening and around the epitaxial source/drain region;
annealing the metal layer to form a silicide around the epitaxial source/drain region; and
depositing a conductive material in the first opening to form a source/drain contact around the silicide.

6. The method of claim 4, wherein etching the ILD comprises etching the second dielectric material at a faster rate than the first dielectric material, and etching the dummy layer comprises etching the first dielectric material at a faster rate than the second dielectric material.

7. The method of claim 4, wherein the first dielectric material is silicon carbonitride and the second dielectric material is silicon oxide.

8. The method of claim 4 further comprising:
before depositing the ILD, etching a second opening in the dummy layer, wherein depositing the ILD comprises depositing a portion of the ILD in the second opening.

9. The method of claim 1 further comprising:
forming the semiconductor layers over a substrate;
patterning the substrate to form a fin, the second nanostructure disposed over the fin; and
before growing the epitaxial source/drain region, trimming an upper portion of the fin.

10. The method of claim 1, wherein forming the gate stack comprises:
removing remaining portions of the first nanostructure and the third nanostructure to expose the top and the bottom of the second region of the second nanostructure;
depositing a gate dielectric around the top and the bottom of the second region of the second nanostructure; and
forming a gate electrode on the gate dielectric.

11. A device comprising:
a first nanostructure over a substrate, the first nanostructure comprising a channel region and a first lightly doped source/drain (LDD) region, the first LDD region adjacent the channel region, the first LDD region having a first thickness, the channel region having a second thickness, the second thickness greater than the first thickness;
a first epitaxial source/drain region wrapped around four sides of the first LDD region;
an interlayer dielectric (ILD) over the first epitaxial source/drain region;
a source/drain contact extending through the ILD, the source/drain contact wrapped around four sides of the first epitaxial source/drain region; and
a gate stack adjacent the source/drain contact and the first epitaxial source/drain region, the gate stack wrapped around four sides of the channel region.

12. The device of claim 11 further comprising:
a second nanostructure over the substrate, the second nanostructure comprising a second LDD region; and
a second epitaxial source/drain region wrapped around four sides of the second LDD region, the source/drain contact wrapped around four sides of the second epitaxial source/drain region.

13. The device of claim 12 further comprising:
a first spacer disposed between the gate stack and the first epitaxial source/drain region, the source/drain contact physically contacting the first spacer; and
a second spacer disposed between the gate stack and the second epitaxial source/drain region, the source/drain contact physically contacting the second spacer.

14. The device of claim 12, wherein the source/drain contact has a first portion and a second portion, the first portion extending through the ILD, the second portion disposed between the first epitaxial source/drain region and the second epitaxial source/drain region, the second portion having a greater width than the first portion.

15. A device comprising:
a nanostructure over a substrate, the nanostructure comprising a channel region and a lightly doped source/drain (LDD) region, the LDD region adjacent the channel region, the channel region having a first width and a first thickness in a first cross-section, the LDD region having a second width and a second thickness in a second cross-section, the second width being less than the first width, the second thickness being less than the first thickness, the first cross-section and the second cross-section each being perpendicular to a longitudinal axis of the nanostructure;
a gate stack completely surrounding the channel region in the first cross-section; and
an epitaxial source/drain region completely surrounding the LDD region in the second cross-section.

16. The device of claim 15 further comprising:
an interlayer dielectric (ILD) over the epitaxial source/drain region; and
a source/drain contact extending through the ILD, the source/drain contact completely surrounding the epitaxial source/drain region in the second cross-section.

17. The device of claim 16 further comprising:
a silicide between the source/drain contact and the epitaxial source/drain region, the silicide completely surrounding the epitaxial source/drain region in the second cross-section.

18. The device of claim 15 further comprising:
an isolation region over the substrate; and
a fin having a first portion and a second portion, the first portion extending through the isolation region, the second portion extending above the isolation region, the nanostructure disposed over the fin, the first portion of the fin having a third width, the second portion of the fin having a fourth width, the second width and the fourth width being less than the third width.

19. The device of claim 15 further comprising:
an interlayer dielectric (ILD) over the epitaxial source/drain region; and
a source/drain contact having a first portion extending through the ILD and having a second portion surrounding the epitaxial source/drain region in the second cross-section, the second portion having a greater width than the first portion in the second cross-section.

20. The device of claim 15 further comprising:
a spacer on a third region of the nanostructure, the third region of the nanostructure having the first width and the first thickness.

* * * * *